US011626877B2

(12) United States Patent
Niikura

(10) Patent No.: US 11,626,877 B2
(45) Date of Patent: Apr. 11, 2023

(54) DRIVING CIRCUIT FOR HIGH-SIDE TRANSISTOR

(71) Applicant: ROHM CO., LTD., Kyoto (JP)

(72) Inventor: Hiroki Niikura, Kyoto (JP)

(73) Assignee: ROHM CO., LTD., Kyoto (JP)

(*) Notice: Subject to any disclaimer, the term of this patent is extended or adjusted under 35 U.S.C. 154(b) by 197 days.

(21) Appl. No.: 16/889,195

(22) Filed: Jun. 1, 2020

(65) Prior Publication Data

US 2020/0382122 A1 Dec. 3, 2020

(30) Foreign Application Priority Data

May 30, 2019 (JP) .............................. JP2019-101380

(51) Int. Cl.
| H03K 19/0185 | (2006.01) |
| H02M 3/155 | (2006.01) |
| H02M 1/08 | (2006.01) |
| H03K 3/037 | (2006.01) |

(52) U.S. Cl.
CPC ...... H03K 19/018507 (2013.01); H02M 1/08 (2013.01); H02M 3/155 (2013.01); H03K 3/037 (2013.01)

(58) Field of Classification Search
CPC ........... H03K 19/018507; H03K 3/037; H03K 19/0185; H02M 1/08; H02M 3/155; H02M 7/5387; H02M 1/0006; H02M 1/0048; H02M 3/158; H02M 3/00; H02M 3/156; Y02B 70/10
See application file for complete search history.

(56) References Cited

U.S. PATENT DOCUMENTS

| 6,639,427 B2* | 10/2003 | Dray ...................... G11C 5/145 365/189.11 |
| 8,633,745 B1* | 1/2014 | Peterson ........ H03K 19/018521 327/147 |
| 10,116,297 B1* | 10/2018 | Wu ................. H03K 19/017509 |
| 2012/0081149 A1 | 4/2012 | Akahane |
| 2014/0354342 A1* | 12/2014 | Lou .................. H03K 3/356182 327/333 |

FOREIGN PATENT DOCUMENTS

| JP | 2012070333 A | 4/2012 |
| JP | 2014053895 A | 3/2014 |
| WO | 2012043750 A1 | 4/2012 |

OTHER PUBLICATIONS

JPO Notice of Reasons for Refusal corresponding to JP Application No. 2019-101380; dated Jan. 31, 2023.

* cited by examiner

Primary Examiner — John W Poos
Assistant Examiner — Tyler J Pereny
(74) Attorney, Agent, or Firm — Cantor Colburn LLP

(57) ABSTRACT

A high-side driving circuit drives a high-side transistor configured as an N-channel or NPN transistor, according to an input signal. A level shift circuit level shifts the input signal. A latch stabilization circuit selects one node that corresponds to an output of the level shift circuit, from among a first node and a second node configured as complementary nodes provided to a latch circuit, and sinks a current from the node thus selected.

19 Claims, 15 Drawing Sheets

DRIVING CIRCUIT FOR HIGH-SIDE TRANSISTOR

CROSS REFERENCE TO RELATED APPLICATIONS

The present invention claims priority under 35 U.S.C. § 119 to Japanese Application No. 2019-101380 filed May 30, 2019, the entire content of which is incorporated herein by reference.

BACKGROUND OF THE INVENTION

1. Field of the Invention

The present invention relates to a driving circuit for a high-side transistor.

2. Description of the Related Art

A switching circuit including a power transistor and a driving circuit thereof (gate driving circuit) is employed in various kinds of applications such as DC/DC converters, power conversion apparatuses, motor driving circuits, etc.

FIG. 1 is a circuit diagram showing a switching circuit. A switching circuit 100R includes a high-side transistor MH, a low-side transistor ML, a high-side driving circuit 200R, and a low-side driving circuit 110.

The high-side transistor MH is arranged between an input terminal (or an input line) IN and a switching terminal (or a switching line) VS. The low-side transistor ML is arranged between the switching terminal VS and a ground terminal GND. The high-side driving circuit 200R drives the high-side transistor MH according to a control input HIN. The low-side driving circuit 110 drives the low-side transistor ML according to a control input LIN.

When the high-side transistor NH is turned on, and the low-side transistor ML is turned off, an input voltage $V_{IN}$ occurs at the switching terminal VS. When the high-side transistor MH is turned off, and the low-side transistor ML is turned on, a ground voltage $V_{GND}$ (0 V) occurs at the switching terminal VS. In a period in which both the high-side transistor MH and the low-side transistor ML are turned off, the switching terminal VS is set to a high-impedance state. The switching circuit 100R switches the state of the switching terminal VS between the above-described three states so as to supply power to an unshown load.

In some cases, the high-side transistor M H is configured as an N-type (N-channel) transistor. In order to turn on the high-side transistor M H and to maintain the on state, the high-side transistor MH requires a voltage that exceeds a FET gate threshold value $V_{GS(th)}$ to be applied as the gate-source voltage. When the high-side transistor MH is turned on, the voltage $V_S$ at the switching line VS, i.e., the source voltage of the high-side transistor MH, is substantially equal to the input voltage $V_{IN}$. Accordingly, in order to maintain the on state of the high-side transistor MH, there is a need to apply a gate signal that is higher than $(V_{IN}+V_{GS(th)})$ to the gate of the high-side transistor MH.

In order to generate a gate signal that is higher than the input voltage $V_{IN}$, a bootstrap circuit is provided. The bootstrap circuit includes a bootstrap capacitor C1 and a rectifier element D1. The bootstrap capacitor C1 is arranged between a bootstrap terminal (or bootstrap line) VB and the switching terminal VS. A DC voltage $V_{REG}$ (which is higher than $V_{GS(th)}$) is applied to the bootstrap terminal VB via the rectifier element D1.

When the switching voltage $V_S$ is set to the low level (0 V), the capacitor C1 is charged via the rectifier element D1. In this state, the voltage across the capacitor C1 becomes $\Delta V=V_{REG}-Vf$. Here, Vf represents a voltage drop across the rectifier element D1. When the switching voltage $V_S$ rises, the voltage $V_B$ at the bootstrap terminal VB also rises while maintaining the relation $V_B=V_S+\Delta V$. By providing the bootstrap circuit, such an arrangement allows the voltage difference between the VB terminal and the VS terminal to be maintained at $\Delta V$.

The high-side driving circuit 200R includes a buffer (driver) 210 and a level shift circuit 220. A voltage $V_B$ is supplied to an upper-side power supply terminal of the buffer 210. A voltage $V_S$ is supplied to a lower-side power supply terminal of the buffer 210. The buffer 210 supplies a gate voltage that is switchable between $V_B$ employed as the high level and $V_S$ employed as the low level to the gate of the high-side transistor MH.

The level shift circuit 220 converts the binary control signal HIN having a logic level ($V_{DD}$ or 0V) into a binary intermediate signal LVSFTOUT having a level of $V_D$ or $V_S$.

FIG. 2 is a circuit diagram showing the high-side driving circuit 200R. The level shift circuit 220 includes a pulse generator 222, inverters 224, 225, 226, and 227, and a logic circuit 228.

It is difficult to manufacture a high-breakdown-voltage PMOS transistor. Accordingly, instead of configuring the inverters 224 and 225 as CMOS inverters, the inverters 224 and 225 are each configured of a high-breakdown-voltage NMOS transistor and a load resistor. With the inverters 224 and 225, during an on period of the NMOS transistor, a current I flows from the VB line toward the GND line, which involves power consumption of $(V_B \times I_d)$. With a high-voltage application with an input voltage $V_{IN}$ that is higher than 100 V, the voltage $V_B$ also rises to a value on the order of the input voltage $V_{IN}$. This leads to large power consumption of the inverters 224 and 225. In order to solve such a problem, in a high-voltage application, the inverters 224 and 225 are pulse driven, thereby providing reduced power consumption.

Specifically, the pulse generator 222 detects a positive edge and a negative edge of the control signal HIN, and generates a first edge signal Ep and a second edge signal En. The first inverter 224 receives the first edge signal Ep, and outputs an inverted set signal ⌈SET ("⊻" represents logical inversion, which is indicated by a bar in the drawings). The second inverter 225 receives the second edge signal En, and outputs the inverted reset signal ⊻RST.

The inverters 226 and 226 respectively invert the inverted set signal ⊻SET and the inverted reset signal ⊻RST, so as to generate a set signal SET and a reset signal RST. The logic circuit 228 generates a control pulse Sp that is set to the on level according to the set signal SET, and that is set to the off level according to the reset signal RST.

As a result of investigating the high-side driving circuit 200R shown in FIG. 2, the present inventor has recognized the following problem.

As a lower-side NMOS transistor employed in the first inverter 224 and the second inverter 225, a high-breakdown-voltage element having a DMOS (Double-Diffused MOS) structure is employed.

Such a high-breakdown-voltage transistor involves a non-negligible parasitic capacitance Cp1 or Cp2 between the drain and source, between the drain and the gate, or between the drain and substrate. In a case in which a delay occurs in the inverted set signal ¥SET or the inverted reset signal RST due to the effects of the parasitic capacitances Cp1 and Cp2, the correct set signal SET and the correct reset signal RST cannot be transmitted to the logic circuit 228. This becomes a factor that leads to an abnormal operation.

In order to solve this problem, an approach is conceivable in which a simultaneous occurrence of the set signal SET and the reset signal RST is masked. However, in a case of employing this approach, when a reset signal RST is generated in a transition of a switching operation (before the completion of a turn-on operation of the high-side transistor MH in the turn-on operation thereof, for example), the reset signal SRT is masked. In this case, such an arrangement has a problem in that the high-side transistor MH cannot be immediately turned off.

SUMMARY OF THE INVENTION

The present invention has been made in order to solve such a problem. It is an exemplary purpose of an embodiment of the present invention to provide a driving circuit that is capable of driving a high-side transistor with high precision.

An embodiment of the present invention relates to a driving circuit for an N-channel or NPN high-side transistor. The driving circuit comprises: a level shift circuit structured to shift up an input signal; and a buffer structured to drive the high-side transistor according to an output of the level shift circuit. The level shift circuit comprises: a pulse generator structured to generate a set pulse according to a positive edge of the input signal, and to generate a reset pulse according to a negative edge of the input signal; an open drain circuit comprising a first transistor arranged such that a source thereof is grounded and structured to turn on according to the set pulse, and a second transistor arranged such that a source thereof is grounded and structured to turn on according to the reset pulse; a latch circuit comprising a cross-coupled first transistor and second transistor, and structured to switch a state thereof according to an output of the open drain circuit; and a latch stabilization circuit arranged between a high-side line and a switching line, and structured to select a node that corresponds to an output of the level shift circuit, from among a first node and a second node configured as complementary nodes provided to the latch circuit, and to fixedly set the node thus selected to a low level.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Overview of the Embodiments

Figure 1:
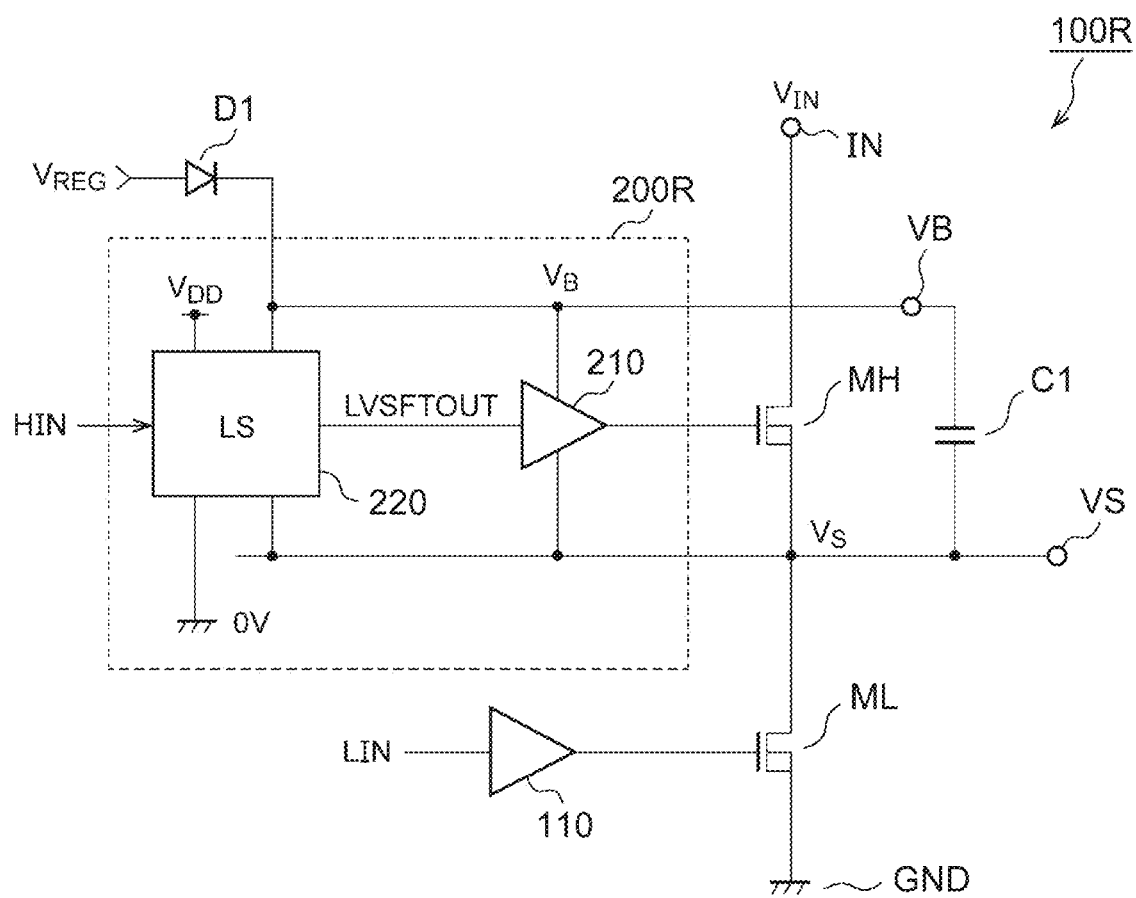
FIG. 1 is a circuit diagram showing a switching circuit.
Figure 2:
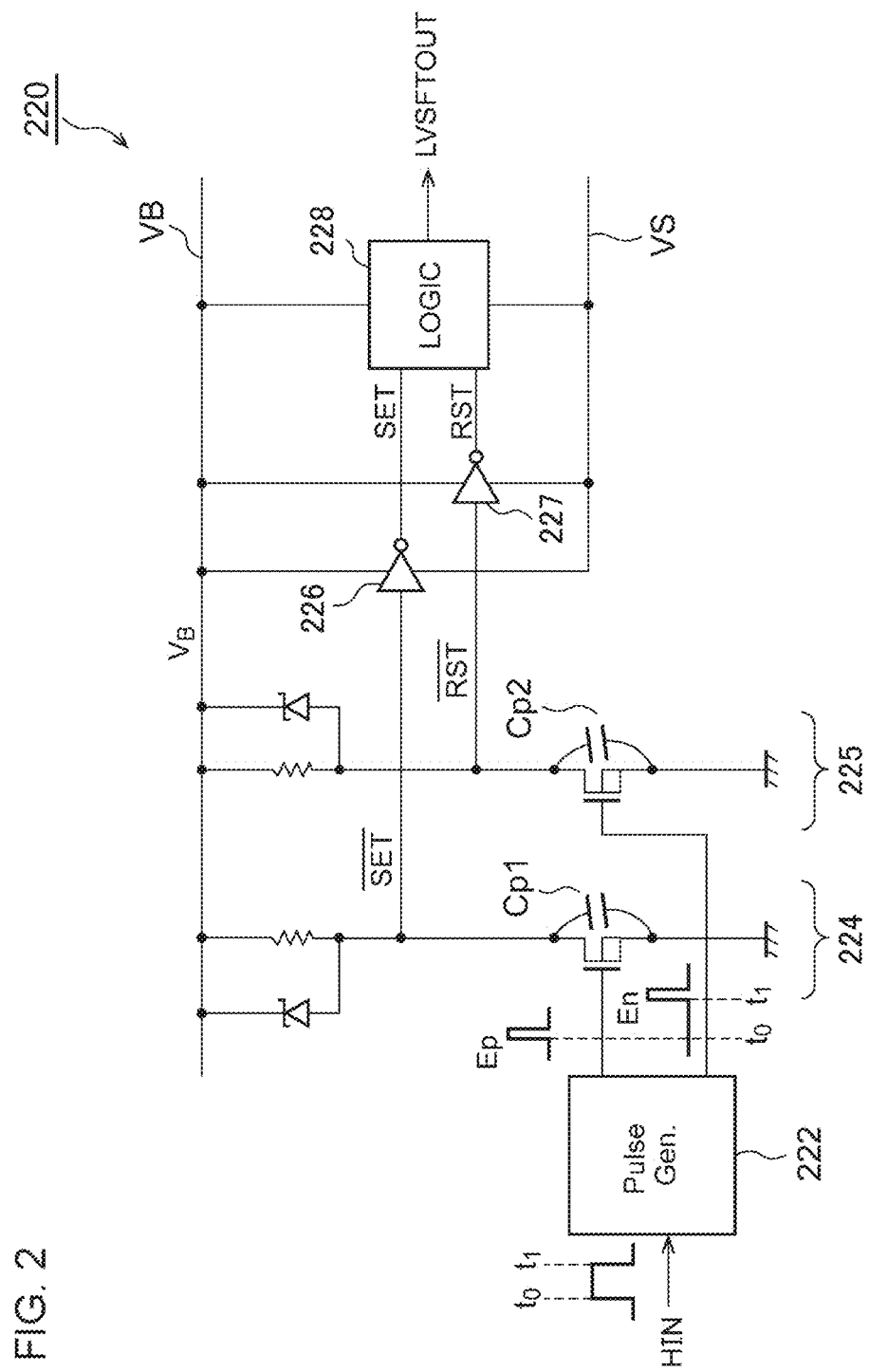
FIG. 2 is a circuit diagram showing a high-side driving circuit.

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later.

An embodiment disclosed in the present specification relates to a driving circuit for an N-channel or NPN high-side transistor. The driving circuit comprises: a level shift circuit structured to shift up an input signal; and a buffer structured to drive the high-side transistor according to an output of the level shift circuit. The level shift circuit comprises: a pulse generator structured to generate a set pulse according to a positive edge of the input signal, and to generate a reset pulse according to a negative edge of the input signal; an open drain circuit comprising a first transistor having its source grounded and structured to turn on according to the set pulse, and a second transistor having its source grounded and structured to turn on according to the reset pulse; a latch circuit comprising a cross-coupled first transistor and second transistor, and structured to switch a state thereof in response to an output of the open drain circuit; and a latch stabilization circuit arranged between a high-side line and a switching line, and structured to select a node that corresponds to an output of the level shift circuit, from among a first node and a second node configured as complementary nodes provided to the latch circuit, and to fixedly set the node thus selected to a low level.

The latch stabilization circuit acts on the first node and the second node according to the output of the level shift circuit so as to fix the state of the latch circuit. The latch stabilization circuit is not required to switch the state of the latch circuit. Accordingly, the latch stabilization circuit requires only a small amount of operation current. In addition, the latch stabilization circuit is arranged between the high-side line and the switching line having a voltage difference between them on the order of 5 V or 12 V. Thus, such an arrangement allows the power consumption required to fix the state of the latch circuit to be dramatically reduced, as compared with an arrangement in which a current flows between the high-side line and the ground line having a voltage difference between them on the order of several hundred V.

Also, the latch stabilization circuit may be structured to select a node that corresponds to the output of the level shift circuit, from among the first node and the second node configured as complementary nodes provided to the latch circuit, and to sink a current from the node thus selected. By drawing a current from the node, such an arrangement is capable of lowering the electric potential at the node.

Also, the latch stabilization circuit may comprise: a first current source structured such that, when the output of the level shift circuit is set to a first level, the first current source is turned on, so as to sink a current from the first node of the latch circuit; and a second current source structured such that, when the output of the level shift circuit is set to a second level, the second current source is turned on, so as to sink a current from the second node of the latch circuit.

Also, the first current source may comprise: a first switch structured such that, when the output of the level shift circuit is set to the first level, the first switch is turned on; a first impedance element coupled in series with the first switch; and a first current mirror circuit structured to copy a current that flows through the first impedance element, and to sink a current from the first node. Also, the second current source may comprise: a second switch structured such that, when the output of the level shift circuit is set to the second level, the second switch is turned on; a second impedance element coupled in series with the second switch; and a second current mirror circuit structured to copy a current that flows through the second impedance element, and to sink a current from the second node.

Also, the first impedance element and the second impedance element may each be configured as a PMOS transistor having its gate coupled to the switching line. Also, the first impedance element and the second impedance element may each be configured as a resistor.

Also, the latch stabilization circuit may comprise: a first variable impedance element arranged between the switching line and one from among the first node and the second node configured as complementary nodes provided to the latch circuit; and a second variable impedance element arranged between the switching line and the other from among the first node and the second node. Also, the impedance of the first variable impedance element and the impedance of the second variable impedance element may be controlled in a complementary manner according to the output of the level shift circuit.

Also, the level shift circuit may further comprise a level shifter/latch circuit provided as a downstream stage of the latch circuit. Also, the level shifter/latch circuit may comprise: a first PMOS transistor having its source coupled to the high-side line, and a gate thereof is coupled to the first node; a second PMOS transistor having its source coupled to the high-side line and its gate coupled to the second node; a third NMOS transistor having its drain coupled to a drain of the first PMOS transistor and its gate coupled to the first node; a fourth NMOS transistor having its drain coupled to a drain of the second PMOS transistor and its gate coupled to the second node; a fifth NMOS transistor having its drain coupled to a source of the third NMOS transistor, its gate coupled to a drain of the second PMOS transistor, and its source coupled to the switching line; and a sixth NMOS transistor having its drain coupled to a source of the fourth NMOS transistor, its gate coupled to a drain of the first PMOS transistor, and its source coupled to the switching line.

By providing the level shifter/latch circuit, such an arrangement is capable of transmitting the output of the latch circuit to a downstream-stage buffer in a sure manner even when the voltage at the switching line falls. Furthermore, even when the electric potential at the high-side line suddenly falls, and the voltages at the first node and the second node of the latch circuit jump, the level shifter/latch circuit allows the immediately preceding output of the level shift circuit to be maintained.

Also, the level shift circuit may further comprise an assist circuit structured to inject an assist current to the second node in response to the set pulse, and to inject an assist current to the first node in response to the reset pulse.

By injecting the current by means of the assist circuit, such an arrangement is capable of canceling out the current that occurs due to a parasitic capacitance. This allows the state of the latch circuit to be switched at high speed. Furthermore, this allows the level shift circuit to transmit the input signal to the buffer at high speed.

Also, the assist circuit may comprise: a first transistor structured as an N-channel transistor, and structured to receive the set pulse via a gate thereof; a first current mirror circuit coupled to the high-side line, and structured to mirror a current that flows through the first transistor; a second transistor structured as an N-channel transistor, and structured to receive the reset pulse via a gate thereof; and a second current mirror circuit coupled to the high-side line, and structured to mirror a current that flows through the second transistor.

EMBODIMENTS

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, a state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Also, the phrase "a signal A (voltage or current) corresponds to a signal B (voltage or current)" means the state in which the signal A has a correlation with the signal B. Specific examples of such a state include: (i) a state in which the signal A is the same as the signal B; (ii) a state in which the signal A is proportional to the signal B; (iii) a state in which the signal A is obtained by shifting the level of the signal B; (iv) a state in which the signal A is obtained by amplifying the signal B; (v) a state in which the signal A is obtained by inverting the signal B; (vi) a desired combination of the aforementioned states (i) through (v); and the like. The range of "corresponds" as described above is determined by the kinds of the signals A and B and the usage of the signals A and B, which can clearly be understood by those skilled in this art.

Embodiment 1

Figure 3:
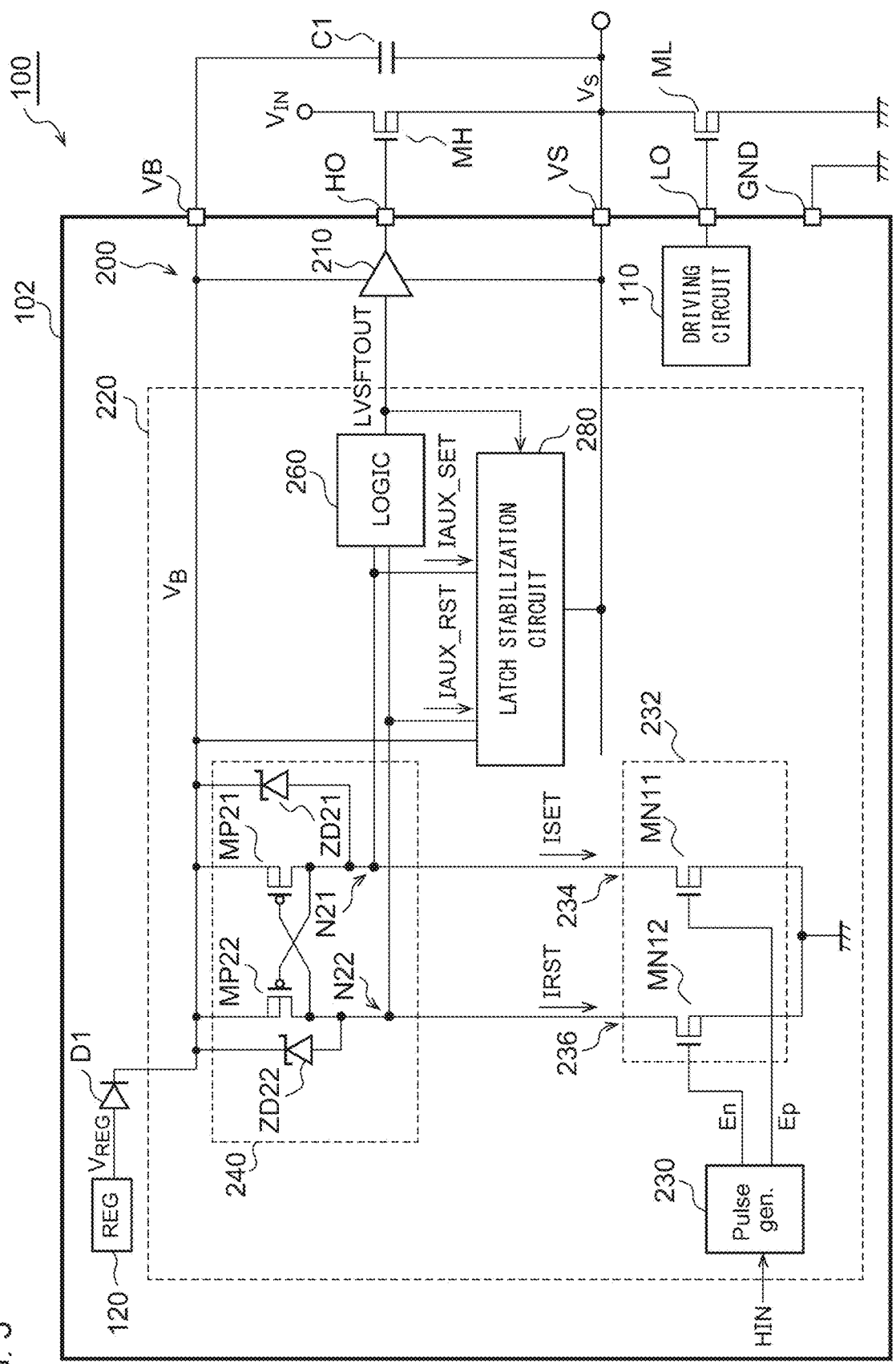
FIG. 3 is a circuit diagram showing a switching circuit according to an embodiment 1.

FIG. 3 is a circuit diagram showing a switching circuit 100 according to an embodiment 1. The switching circuit 100 includes a high-side transistor MH, a low-side transistor ML, a semiconductor apparatus 102 that controls the high-side transistor MH and the low-side transistor ML, and a bootstrap capacitor C1.

The high-side transistor MH is configured as an N-channel transistor or an NPN transistor. The high-side transistor MH is arranged such that its drain receives a DC input voltage $V_{IN}$ and its source is coupled to a switching line VS.

The semiconductor apparatus 102 includes a bootstrap (VB) pin, a switching (VS) pin, a high-side output (HO) pin, a low-side output (LO) pin, and a ground (GND) pin. In the following description, such a pin will also be referred to as a "terminal" or a "line". A bootstrap capacitor C1 is arranged between the VB pin and the VS pin. The HO pin and the LO pin are coupled to the gates (bases) of the high-side transistor MH and the low-side transistor ML, respectively. The VS pin is coupled to the source of the high-side transistor MH and the drain of the low-side transistor ML. The GND pin is grounded.

The semiconductor apparatus 102 includes a low-side driving circuit 110, a regulator 120, a rectifier element D1, and a high-side driving circuit 200.

The low-side driving circuit 110 drives the low-side transistor ML according to a control signal LIN. The regulator 120 generates an internal power supply voltage $V_{REG}$ stabilized to a predetermined voltage level (e.g., 5 V or 12 V). The internal power supply voltage $V_{REG}$ is used as a power supply voltage for each internal block of the semiconductor apparatus 102. The high-side driving circuit 200 drives the high-side transistor MH according to a control signal HIN.

As with the circuit configuration shown in FIG. 1, the switching circuit 100 employs a so-called bootstrap circuit so as to generate a high-level voltage ($V_B$) at the VB line such that it is higher than the input voltage $V_{IN}$. The internal power supply voltage $V_{REG}$ generated by the regulator 120 is supplied to the bootstrap capacitor C1 via a diode D1. In a case in which a DC voltage stabilized to an appropriate voltage level is supplied to the semiconductor apparatus 102 from an external power supply, the regulator 120 may be omitted.

The high-side driving circuit 200 includes a buffer 210 and a level shift circuit 220. The level shift circuit 220 shifts up the input signal HIN that is switchable between the power supply voltage $V_{DD}$ employed as the high level and the ground voltage 0 V employed as the low level, to a signal LVSFTOUT that is switchable between the voltage $V_B$ at the VB line configured as the high level and the voltage $V_S$ at the VS line configured as the low level.

The buffer 210 drives the high-side transistor MH according to the output LVSFTOUT of the level shift circuit 220.

The level shift circuit 220 includes a pulse generator 230, an open drain circuit 232, a latch circuit 240, a logic circuit 260, a latch stabilization circuit 280.

The pulse generator 230 generates a set pulse Ep that corresponds to a positive edge (leading edge) of the input signal HIN, and a reset pulse En that corresponds to a negative edge (trailing edge) of the input signal HIN. The set pulse Ep and the reset pulse En are each generated with a pulse width on the order of several dozen ns.

The open-drain circuit 232 includes high-breakdown-voltage transistors MN11 and MN12. The first transistor MN11 is arranged such that its source is grounded and the set pulse Ep is input to its gate. The second transistor MN12 is arranged such that its source is grounded and the reset pulse En is input to its gate. When the set pulse Ep is set to the low level, the first transistor MN11 is turned off, and a first output 234 of the open-drain circuit 232 is set to the high-impedance state. When the set pulse Ep is set to the high level, the first transistor MN11 is turned on, and a set current $I_{SET}$ is sunk from the first output 234 of the open-drain circuit 232.

As such a high-breakdown-voltage element, a transistor having a DMOS (Double-Diffused MOS) structure is preferably employed. However, various kinds of transistors having other structures may be employed, examples of which include HVMOS (High Voltage MOSFET), LDMOS (Lateral Diffusion MOSFET), IGBT (Insulated Gate Bipolar Transistor), SiC (Silicon carbide)-JFET, SIC-MOSFET, etc. Other transistors are each configured as an ordinary-breakdown-voltage MOSFET unless otherwise specified as a "high-breakdown-voltage element".

In the same manner, when the reset pulse En is set to the low level, the second transistor MN12 is turned off, and a second output 236 of the open-drain circuit 232 is set to the high-impedance state. When the reset pulse En is set to the high level, the second transistor MN12 is turned on, and a reset current $I_{RST}$ is sunk from the second output 236 of the open-drain circuit 232.

The latch circuit 240 includes a first transistor MP21 and a second transistor MP22, which are cross-coupled. The latch circuit 240 switches its state according to the outputs (ISET and IRST) of the open-drain circuit 232. The sources of the first transistor MP21 and the second transistor MP22 are coupled to the VB line. The drains of the first transistor MP21 and the second transistor MP22 are coupled to the outputs 234 and 236 of the open-drain circuit 232, respectively. Furthermore, the gate of the first transistor MP21 is coupled to the drain of the second transistor MP22. The gate of the second transistor MP22 is coupled to the drain of the first transistor MP21. The drain of the first transistor MP21 and the drain of the second transistor MP22 will be referred to as a "first node N21" and a "second node N22", respectively. The electric potential at the first node N21 and the electric potential at the second node N22 are changed in a complementary manner. A state in which the first node N21 is set to the low level will be referred to as a "set state". A state in which the second node N22 is set to the low level will be referred to as a "reset state"

It should be noted that the latch circuit 240 may include Zener diodes ZD21 and ZD22 respectively coupled in parallel with the first transistor MP21 and the second transistor MP22. The Zener diodes ZD21 and ZD22 operate so as to clamp the voltage levels at the first node N21 and the second node MP22 such that they do not become lower than $(V_B-V_Z)$, thereby protecting the transistors MP21 and MP22.

The logic circuit 260 receives the output of the latch circuit 240 (at least one from among the voltage at the first node N21 and the voltage at the second node N22), and generates a level-shifted output signal LVSFTOUT. The output LVSFTOUT of the level shift circuit 220 has a logic level that is the opposite of the electric potential at the first node N21 of the latch circuit 240. That is to say, when the first node N21 is set to the low level, LVSFTOUT is set to the high level. When the first node N21 is set to the high level, LVSFTOUT is set to the low level.

The latch stabilization circuit 280 is arranged between the VB line and the VS line. The latch stabilization circuit 280 is configured to select one node that corresponds to the level (high level or low level) of the output LVSFTOUT of the first level shift circuit 220, from among the first node N21 and the second node N22 configured as a complementary node pair provided to the latch circuit 240, and to maintain the low level of the node thus selected.

The output LVSFTOUT of the level shift circuit 220 corresponds to the state of the latch circuit 240. Accordingly, the latch stabilization circuit 280 operates such that when LVSFTOUT is set to the high level, i.e., when the first node N21 is set to the low level, the low level of the first node N21 is maintained, and such that when LVSFTOUT is set to the low level, i.e., when the second node N22 is set to the low level, the low level of the second node N22 is maintained.

For example, the latch stabilization circuit 280 selects one node that corresponds to the level of the output LVSFTOUT of the level shift circuit 220, i.e., one node at which the low level is to be maintained, from among the first node N21 and the second node N22 configured as complementary nodes of the latch circuit 240, and to sink an auxiliary current IAUX_SET or IAUX_RST from the node thus selected.

Figure 4:
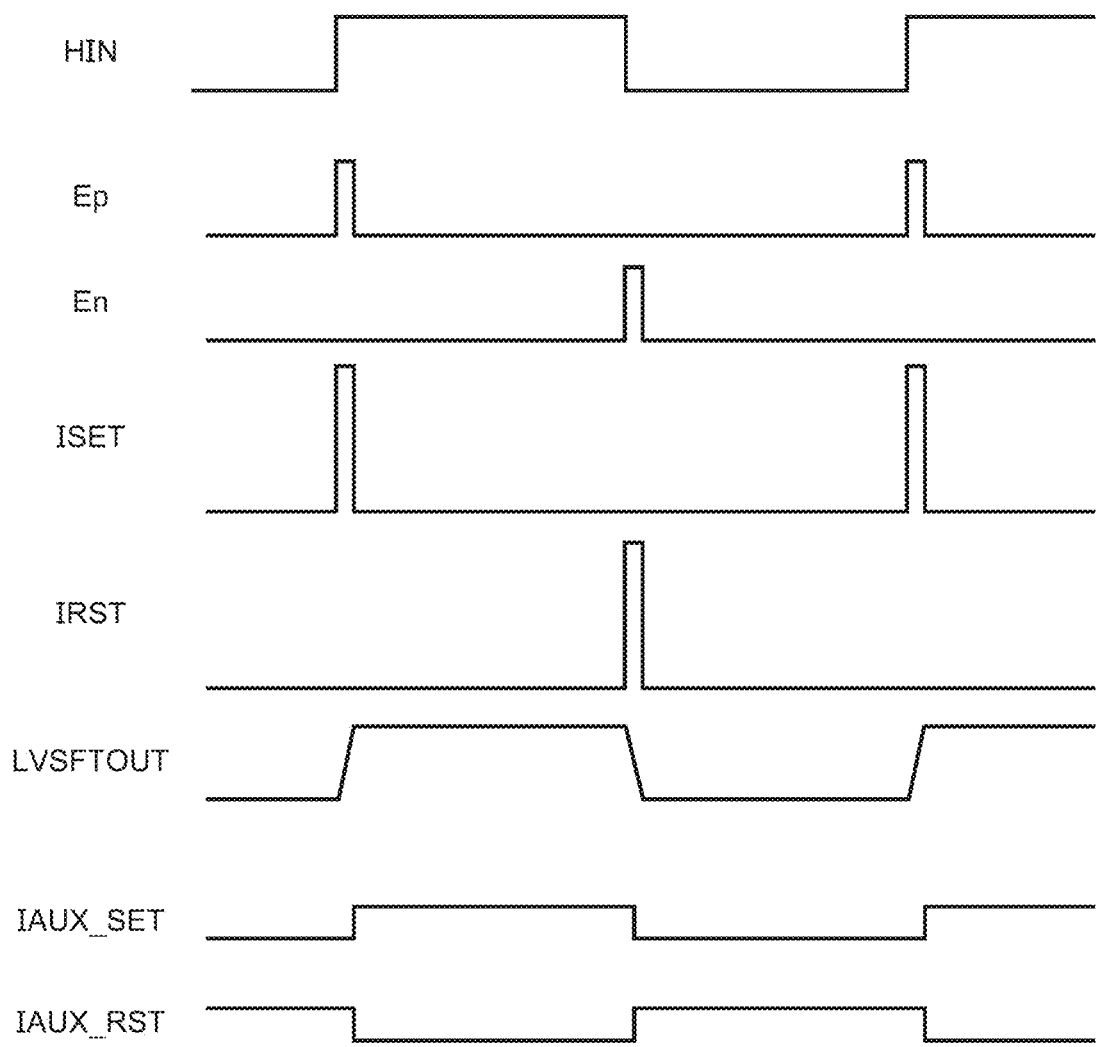
FIG. 4 is an operation waveform diagram showing the operation of the high-side driving circuit shown in FIG. 3.

The above is the configuration of the high-side driving circuit 200. Next, description will be made regarding the operation thereof. FIG. 4 is an operation waveform diagram showing the operation of the high-side driving circuit 200 shown in FIG. 3.

When the input signal HIN transits from the low level to the high level, the set pulse Ep is generated, which provides the flow of the set current $I_{SET}$. This sets the first node N21 of the latch circuit 240 to the low level, which sets the output LVSFTOUT of the logic circuit 260 to the high level. During a period in which the LVSFTOUT signal is set to the high level, the latch stabilization circuit 280 sinks the auxiliary current IAUX_SET from the first node N21. With this, the latch circuit 240 is fixed to the set state.

When the input signal HIN transits from the high level to the low level, the reset pulse En is generated, which provides the flow of the reset current $I_{RST}$. This sets the second node N22 of the latch circuit 240 to the low level, which sets the output LVSFTOUT of the logic circuit 260 to the low level. During a period in which the LVSFTOUT signal is set to the low level, the latch stabilization circuit 280 sinks the auxiliary current IAUX_RST from the second node N22. With this, the latch circuit 240 is fixed to the reset state.

The above is the operation of the high-side driving circuit 200.

The latch stabilization circuit 280 acts on one from among the first node N21 and the second node N22 according to the LVSFTOUT signal. This allows the state of the latch circuit 240 to be fixed.

The state switching of the latch circuit 240 is triggered by the set current $I_{SET}$ and the reset current $I_{RST}$. Accordingly, the latch stabilization circuit 280 is not required to switch the state of the latch circuit 240. Accordingly, the latch stabilization circuit 280 requires only a very small amount of the operation current (auxiliary currents IAUX_SET and IAUX_RST). For example, the set current $I_{SET}$ and the reset current $I_{RST}$ are each on the order of several mA. In contrast, the auxiliary currents IAUX_SET and IAUX_RST are each required to be on the order of several µA to several dozen µA. Accordingly, the latch stabilization circuit 280 involves only a small impact on an increase in power consumption.

In addition, the latch stabilization circuit 280 is arranged between the VB line and the VS line. The voltage difference between the VB line and the VS line is determined by the internal power supply voltage $V_{REG}$, which is on the order of 5 V or 12 V. In a case in which a current I flows between the VB line and the ground line having a voltage difference of several hundred V (e.g., 600 V), this involves power consumption of (600 V×I). In contrast, with the present embodiment, this involves only small power consumption of (12 V×I). That is to say, such an arrangement requires only a very small increase in power consumption.

Figure 5:
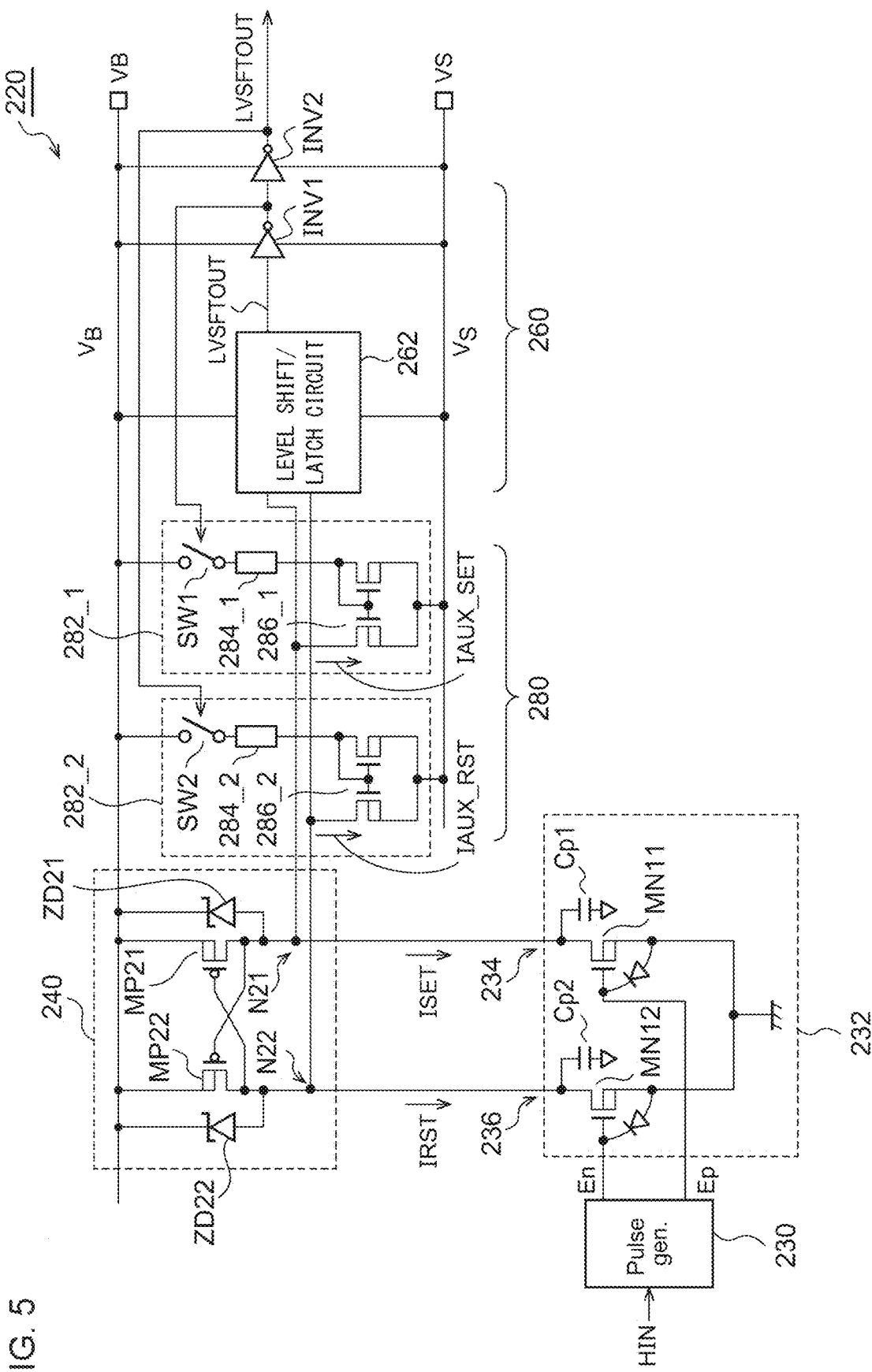
FIG. 5 is a circuit diagram showing an example configuration of a level shift circuit.

Next, description will be made regarding specific example configurations and modifications of the high-side driving circuit 200. FIG. 5 is a circuit diagram showing an example configuration of the level shift circuit 220.

The latch stabilization circuit 280 includes a first current source 282_1 and a second current source 282_2. When the output LVSFTOUT of the level shift circuit 220 is set to the first level (high level), the first current source 282_1 is turned on. In this state, the first current source 282_1 sinks the current IAUX_SET from the first node N21 of the latch circuit 240. When the output LVSFTOUT of the level shift circuit 220 is set to the second level (low level), the second current source 282_2 is turned on. In this state, the second current source 282_2 sinks the current IAUX_RST from the second node N22 of the latch circuit 240.

The first current source 282_1 includes a first switch SW1, a first impedance element 284_1, and a first current mirror circuit 286_1. When the output LVSFTOUT of the level shift circuit 220 is set to the first level (high level), the first switch SW1 is turned on. The first impedance element 284_1 is coupled to the first switch SW1 in series. The first current mirror circuit 286_1 copies the current that flows through the first impedance element 284_1 so as to sink the current IAUX_SET from the first node N21.

The second current source 282_2 has the same configuration as that of the first current source 282_1. The second current source 282_2 includes a second switch SW2, a second impedance element 284_2, and a second current mirror circuit 286_2.

The logic circuit 260 includes a level shifter/latch circuit 262 and inverters INV1 and INV2. The level shifter/latch circuit 262 receives the output of the latch circuit 240, and latches the output thus received. The output of the latch circuit 240 is configured as a signal that is switchable between the voltage $V_B$ employed as the high level and $(V_B-V_Z)$ employed as the low level. The level shifter/latch circuit 262 shifts up the output of the latch circuit 240 to the signal LVSFTOUT that is switchable between the voltage $V_B$ employed as the high level and the voltage $V_S$ employed as the low level.

The inverters INV1 and INV2 control the on/off operations of the first switch SW1 and the second switch SW2, respectively. In this example, the first switch SW1 and the second switch SW2 each employ negative logic input in which the switch is turned on when the low level is input. Accordingly, when LVSFTOUT is set to the high level, the first switch SW1 is turned on. Conversely, when LVSFTOUT is set to the low level, the second switch SW2 is turned on.

Figure 6:
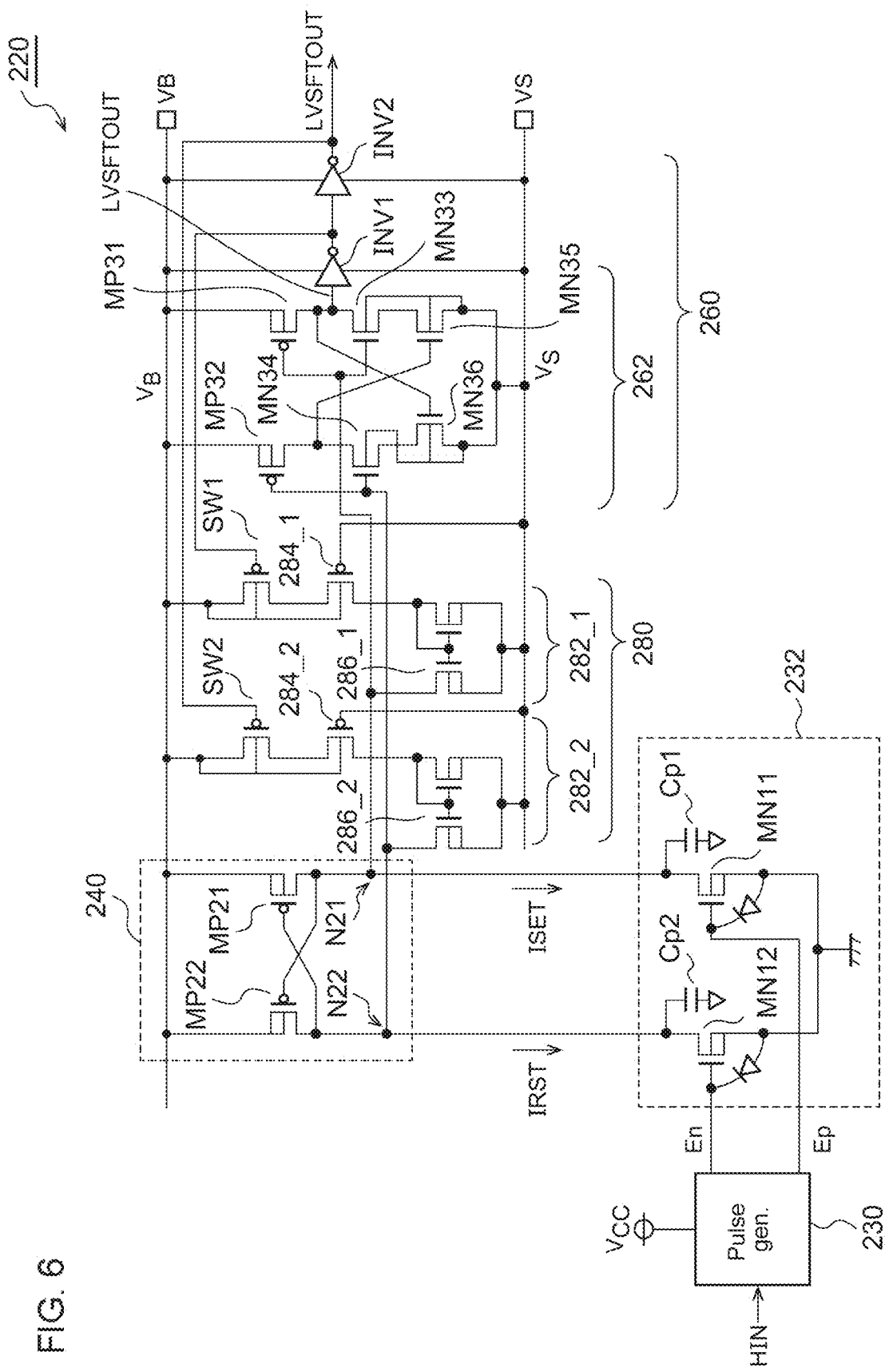
FIG. 6 is a circuit diagram showing a further specific example configuration of the level shift circuit.

FIG. 6 is a circuit diagram showing a further specific example configuration of the level shift circuit 220. The first switch SW1 and the second switch SW2 may each be configured as a PMOS transistor. Furthermore, the first impedance element 284_1 and the second impedance element 284_2 are each configured as a PMOS transistor arranged such that its gate is coupled to the VS line. The behavior of each impedance element can be regarded as a resistance component.

The level shifter/latch circuit 262 includes transistors MP31, MP32, and MN33 through MN36. The first PMOS transistor MP31 is arranged such that its source is coupled to the VB line and its gate is coupled to the first node N21. The second PMOS transistor MP32 is arranged such that its source is coupled to the VB line and its gate is coupled to the second node N22. The third NMOS transistor MN33 is arranged such that its drain is coupled to the drain of the first PMOS transistor MP31 and its gate is coupled to the first node N21. The fourth NMOS transistor MN34 is arranged such that its drain is coupled to the drain of the second PMOS transistor MP32 and its gate is coupled to the second node N22. The fifth NMOS transistor MN35 is arranged such that its drain is coupled to the source of the third NMOS transistor MN33, its gate is coupled to the drain of the second PMOS transistor MP32, and its source is coupled to the VS line. The sixth NMOS transistor MN36 is arranged such that its drain is coupled to the source of the fourth NMOS transistor MN34, its gate is coupled to the drain of the first PMOS transistor MP31, and its source is coupled to the VS line.

The advantage of the level shifter/latch circuit 262 shown in FIG. 6 can be clearly understood based on a comparison with a comparison technique.

A logic circuit 260A according to a comparison technique has the same configuration as that of the logic circuit 260 shown in FIG. 6 except that the logic circuit 260A does not include the level shifter/latch circuit 262. With such an arrangement, the inverter INV1 directly receives the output of the latch circuit 240. Such a comparison technique has the potential to have two problems as described below.

Such an inverter-input logic circuit 260A has an input threshold $V_{TH(INV)}$ that is the midpoint between $V_B$ and $V_S$. Accordingly, in a case in which the switching voltage $V_S$ deviates toward the negative voltage side, this reduces the threshold $V_{TH(INV)}$. When the threshold $V_{TH(INV)}$ becomes lower than the low level of the input of the logic circuit 260A, i.e., becomes lower than $(V_B-V_Z)$, the LVSFTOUT signal does not reflect the state transition of the latch circuit 240. That is to say, such an arrangement has a problem in that the switching of the high-side transistor MH is stopped. This is the first problem.

The voltage $V_B$ at the VB line changes at high speed following the switching voltage $V_S$. With the nodes N21 and N22, there are parasitic capacitances Cp1 and Cp2 each storing charge. When the voltage $V_B$ is lowered at high speed, this involves a reduction of the electric potentials at the nodes N21 and N22. This requires the parasitic capacitances Cp1 and Cp2 to be discharged. The charges thus discharged flow to the VB line via the body diodes of the transistors MP21 and MP22. As a result, the electric potentials at the nodes N21 and N22 jump to $(V_B+V_F)$. Here, "$V_F$" represents the forward voltage of the body diode.

If the voltage $V_B$ suddenly falls in the set state of the latch circuit 240 (in a state in which the first node N21 is set to the low level), the electric potential at the first node N21 jumps to $(V_B+V_F)$ and exceeds the threshold value of the logic circuit 260A configured as a downstream stage. Accordingly, the LVSFTOUT signal is set to the high level, leading to an abnormal operation. This is the second problem.

With the level shifter/latch circuit 262 shown in FIG. 6, such problems can be solved. Description will be made regarding the operation of the level shifter/latch circuit 262.

The level shifter/latch circuit 262 shown in FIG. 6 appears to have an inverter input configuration. However, the transistors MN35 and MN36 are provided as additional components. Accordingly, the level shifter/latch circuit 262 has a PMOS input configuration with the voltage $V_B$ as a reference voltage. That is to say, the logic circuit 260 has an input threshold $V_{TH}=V_B-V_{GS(th)}$, which differs from the input threshold $V_{TH(INV)}$ of the inverter input configuration (i.e., the midpoint between $V_B$ and $V_S$). Here, $V_{GS(th)}$ represents the threshold voltage of the PMOS transistors MP31 and MP32.

The level shifter/latch circuit 262 shown in FIG. 6 has a PMOS input configuration. Accordingly, the level shifter/latch circuit 262 has a constant threshold $V_{TH}=V_B-V_{GS(th)}$ regardless of a change in the switching voltage $V_S$. Accordingly, such an arrangement allows the nodes N21 and N22 to be set to electric potentials that are lower than the threshold $V_{TH}$. Thus, the level shifter/latch circuit 262 is capable of propagating the state of the latch circuit 240 to a downstream-stage circuit in a sure manner. That is to say, this arrangement is capable of solving the first problem.

The level shifter/latch circuit 262 is provided with improved robustness against a sudden reduction in the voltage $V_B$ at the VB line.

Description will be made regarding a case in which the latch circuit 240 is in the set state before the voltage $V_B$ changes. In this state, the LVSFTOUT signal is set to the high level, a relatively high gate voltage is applied to the transistor MN36, and a relatively low gate voltage is applied to the transistor MN35. Accordingly, the transistor MN36 is set to an impedance state that is lower than that of the transistor MN35.

Let us consider a case in which the voltage $V_B$ suddenly falls in the set state. In this case, as described above, the electric potentials at the first node N21 and the second node N22 jump to $(V_B+V_F)$, thereby turning off both the PMOS transistors MP31 and MP32. The transistor MN33 operates as a source follower circuit with the transistor MN35 as a load thereof. In this case, the voltage $(V_B+V_F)$ is applied to the gate of the transistor MN33. Accordingly, the source voltage of the transistor MN33 becomes $(V_B+V_F)-V_{GSN}$. Here, $V_{GSN}$ represents the gate-source voltage of the transistor MN33.

The LVSFTOUT signal is lower than the source voltage of the transistor MN33 by $V_F$. That is to say, the LVSFTOUT signal is represented by $(V_B+V_F)-V_{GSN}-V_F=V_B-V_{GSN}$. Accordingly, such an arrangement allows the LVSOUT signal to be maintained at the high level.

Description will be made regarding a case in which the latch circuit 240 is in the reset state before the voltage $V_B$ changes. In this state, the LVSFTOUT signal is set to the low level, a relatively low gate voltage is applied to the transistor MN36, and a relatively high gate voltage is applied to the transistor MN35. Accordingly, the transistor MN35 is set to an impedance state that is lower than that of the transistor MN36.

Let us consider a case in which the voltage $V_B$ suddenly falls in the reset state of the latch circuit 240. In this case, as described above, the electric potentials at the first node N21 and the second node N22 jump to $(V_B+V_F)$, thereby turning off both the PMOS transistors MP31 and MP32. The transistor MN34 operates as a source follower circuit with the transistor MN36 as a load. In this case, the voltage $(V_B+V_F)$ is applied to the gate of the transistor MN34. Accordingly, the source voltage of the transistor MN34 becomes $(V_B+V_F)-V_{GSN}$. Here, $V_{GSN}$ represents the gate-source voltage of the transistor MN34. The drain voltage of the transistor MN34 becomes lower than the source voltage of the transistor MN34 by $V_F$, which is represented by $(V_S+V_F)-V_{GSN}-V_F=V_B-V_{GSN}$. This voltage is applied to the gate of the transistor MN35. This further reduces an impedance of the transistor MN35, thereby allowing the LVSOUT signal to be maintained at the low level.

Figure 7:
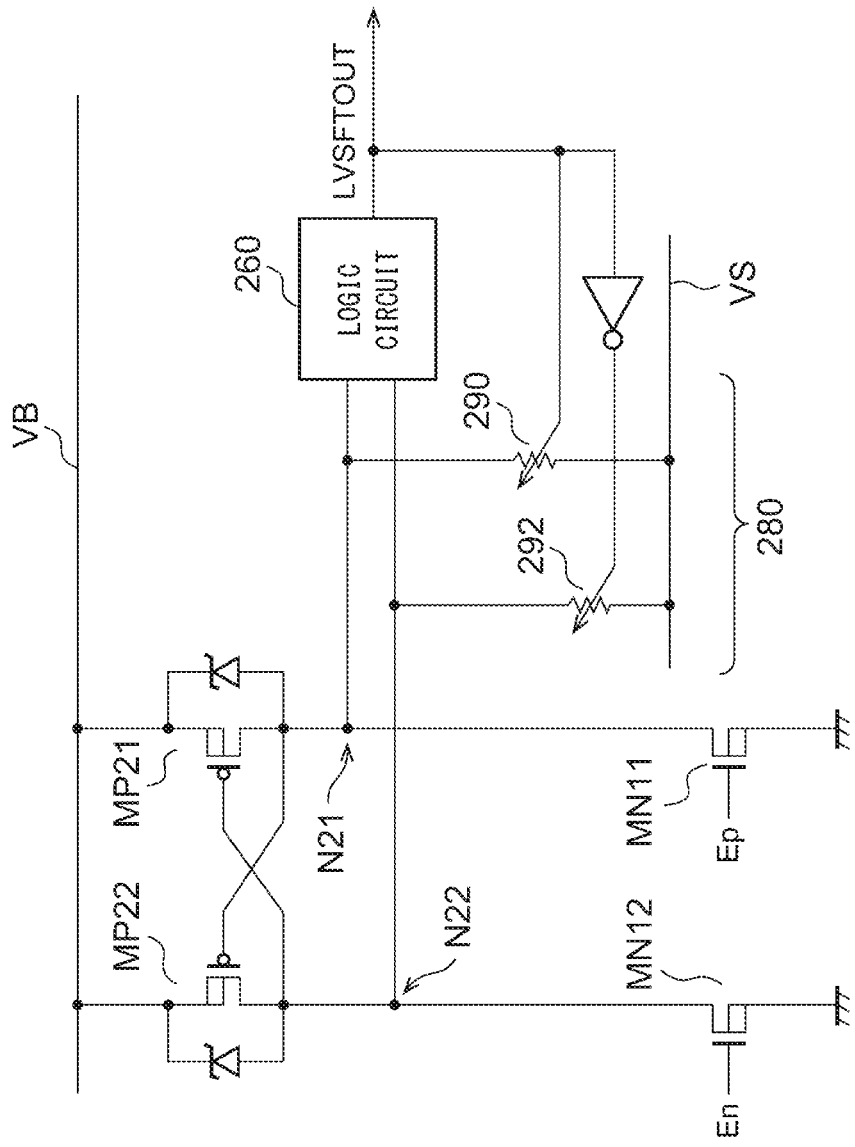
FIG. 7 is a circuit diagram showing another example configuration of a latch stabilization circuit.

FIG. 7 is a circuit diagram showing another example configuration of the latch stabilization circuit 280. The latch stabilization circuit 280 includes a first variable impedance element 290 and a second variable impedance element 292. The first variable impedance element 290 is arranged between the first node N21 and the VS line. The second variable impedance element 292 is arranged between the second node N22 and the VS line. The first variable impedance element 290 and the second variable impedance element 292 have impedances that are controlled in a complementary manner according to the output LVSFTOUT of the level shift circuit 220. Referring to FIG. 5, the output-side NMOS transistor of the first current mirror circuit 286_1 corresponds to the first variable impedance element 290, and the output-side NMOS transistor of the second current mirror circuit 286_2 corresponds to the second variable impedance element 292.

Figure 8:
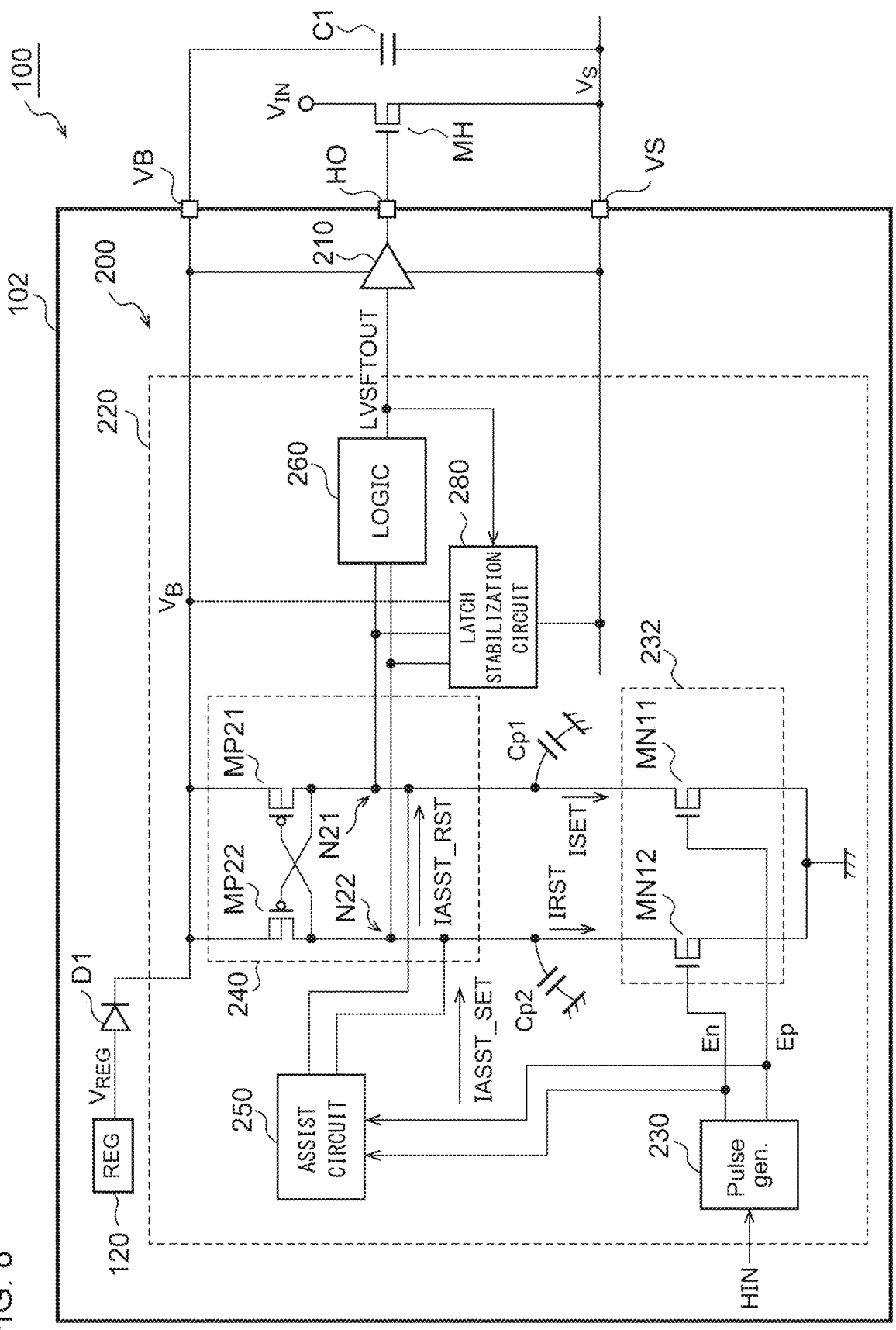
FIG. 8 is a circuit diagram showing a semiconductor apparatus according to a modification.

FIG. 8 is a circuit diagram showing the semiconductor apparatus 102 according to a modification. The level shift circuit 220 shown in FIG. 8 further includes an assist circuit 250. The assist circuit 250 injects an assist current IASST_SET to the second node N22 in response to the set pulse Ep. Furthermore, the assist circuit 250 injects an assist current IASST_RST to the first node N21 in response to the reset pulse En.

Figure 9:
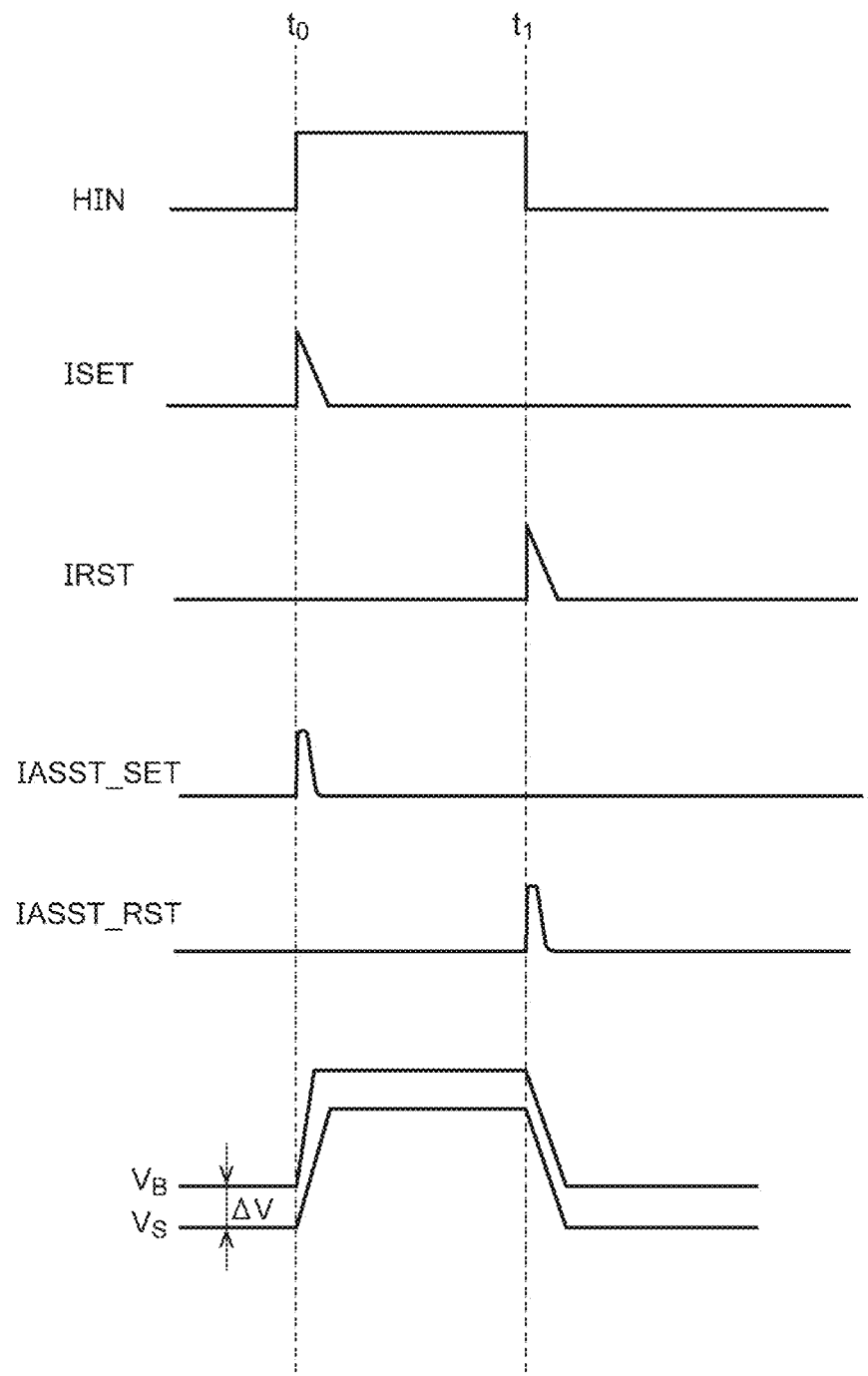
FIG. 9 is an operation waveform diagram showing the operation of a switching circuit shown in FIG. 8.

Next, description will be made regarding the operation of the high-side driving circuit 200 shown in FIG. 8. FIG. 9 is an operation waveform diagram showing the operation of the switching circuit 100 shown in FIG. 8. At the time point $t_0$, the input signal HIN transits from the low level to the high level. Subsequently, at the time point $t_1$, the input signal HIN transits from the high level to the low level. The high level of the input signal HIN corresponds to the on state of the high-side transistor MH. The low level of the input signal HIN corresponds to the off state of the high-side transistor MH.

Before the time point $t_0$, the input signal HIN is maintained at the low level. In this state, the high-side transistor MH is turned off, and the electric potential $V_S$ at the switching line VS is set to the low level.

When the input signal HIN transits to the high level at the time point $t_0$, the open drain circuit 232 sinks the current $I_{SET}$ from the latch circuit 240, which functions as a set trigger. This acts on the first internal node N21 of the latch circuit 240 such that it transits to the low level. Accordingly, the latch circuit 240 starts to transit to the set state, and the LVSFTOUT signal starts to transit to the high level. Subsequently, when the high-side transistor MH is turned on, the electric potential $V_S$ at the switching line VS rises, and the voltage $V_B$ at the VB line also rises.

In order to maintain the set state of the latch circuit 240, the second internal node N22 is required to have an electric potential that is higher than that of the first internal node N21. However, the parasitic capacitance Cp2 impedes the rising of the electric potential at the second internal node N22.

The assist circuit 250 generates the assist current IASST_SET in response to a positive edge of the input signal HIN. The assist current IASST_SET is supplied to the second internal node N22 and the parasitic capacitance Cp2 side. The assist current IASST_SET acts such that the electric potential of the second node N22 rises. Accordingly, such an arrangement is capable of canceling the effect of the parasitic capacitance Cp2. This allows the latch circuit 240 to be immediately switched to the set state according to the set current $I_{SET}$.

When the input signal HIN transits to the low level at the time point $t_1$, the open drain circuit 232 sinks the current $I_{RST}$ from the latch circuit 240, which functions as a reset trigger. The reset current $I_{RST}$ acts such that the second internal node N22 of the latch circuit 240 transits to the low level. Accordingly, the latch circuit 240 starts to transit to the reset state, and the LVSFTOUT signal starts to transit to the low level. Subsequently, when the high-side transistor MH is turned off, the electric potential $V_S$ at the switching line VS decreases, and the voltage $V_B$ at the VB line also decreases.

In order to maintain the reset state of the latch circuit 240, the first internal node N21 is required to have an electric potential that is higher than that of the second internal node N22. However, the parasitic capacitance Cp1 impedes the rising of the electric potential at the first internal node N11.

The assist circuit 250 generates the assist current IASST_RST in response to a negative edge of the input signal HIN. The assist current IASST_RST is supplied to the first internal node N11 and the parasitic capacitance Cp1 side. The assist current IASST_SET acts such that the electric potential of the first node N11 rises. Accordingly, such an arrangement is capable of canceling the effect of the parasitic capacitance Cp1. This allows the latch circuit 240 to be immediately switched to the reset state according to the reset current $I_{RST}$.

As described above, the assist circuit 250 generates the assist currents IASST_SET and IASST_RST in synchronization with the input signal HIN, and supplies the assist currents IASST_SET and IASST_RST thus generated to the latch circuit 240. This allows the latch circuit 240 to switch its state at high speed. This allows the level shift circuit 220 to transmit the input signal HIN to the buffer 210 at high speed.

Figure 10:
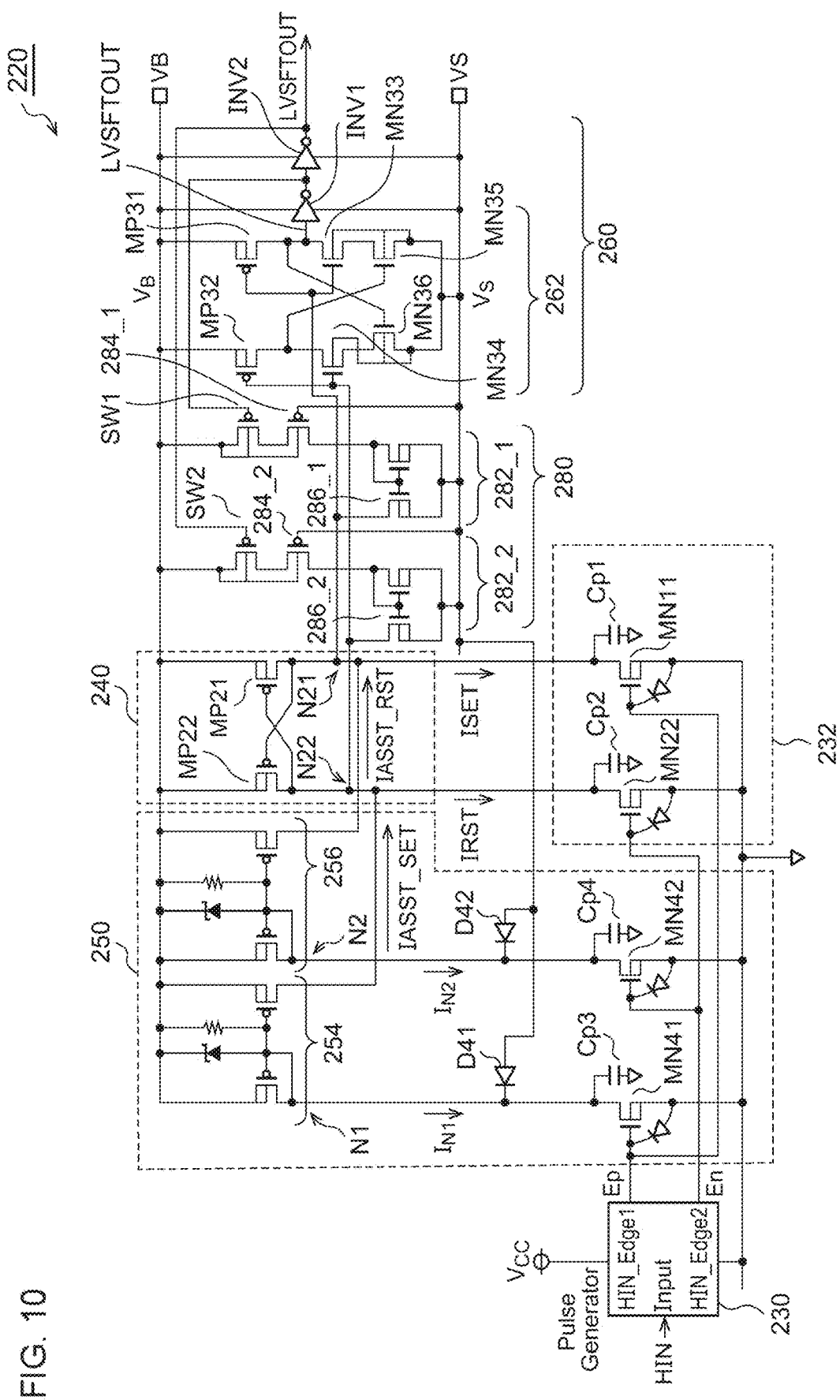
FIG. 10 is a circuit diagram showing a specific example configuration of the level shift circuit shown in FIG. 8.

FIG. 10 is a circuit diagram showing a specific example configuration of the level shift circuit 220 shown in FIG. 8.

The assist circuit 250 includes NMOS transistors MN41 and MN42, a first current mirror circuit 254, and a second current mirror circuit 256.

The transistors MN41 and MN42 are each configured as a high-breakdown-voltage transistor having a DMOS structure, for example. The first transistor MN41 configured as an N-channel transistor is arranged such that its gate receives the set pulse Ep. The first current mirror circuit 254 is coupled to the bootstrap line VB. The first current mirror circuit 254 mirrors the current $I_{N1}$ that flows through the first transistor MN41, so as to generate the IASST_SET signal. The output node of the first current mirror circuit 254 is coupled to the drain of the transistor MP22 of the latch circuit 240 (node N21).

The second transistor MN42 configured as an N-channel transistor is arranged such that its gate receives the reset pulse En. The second current mirror circuit 256 is coupled to the bootstrap line VB. The second current mirror circuit 256 mirrors the current $I_{N2}$ that flows through the second transistor MN42, so as to generate the IASST_RST signal. The output node of the second current circuit 256 is coupled to the drain of the transistor MP21 (node N22).

Such a combination of the first current mirror circuit 254 and the first transistor MN41 can be regarded as a first current source that is switchable between the on state and the off state according to the set pulse Ep. Similarly, such a combination of the second current mirror circuit 256 and the second transistor MN42 can be regarded as a second current source that is switchable between the on state and the off state according to the reset pulse En. Accordingly, the first current mirror circuit 254 or the second current mirror circuit 256 may be replaced with a current source having a different configuration.

A first diode D41 is arranged between the input node N1 of the first current mirror circuit 254 and the switching line VS. The first diode D41 allows the electric potential at the node N1 to be clamped with $(V_S-V_f)$ as its lower limit. This arrangement is capable of preventing overvoltage from being applied to the first current mirror circuit 254. A second diode D42 is arranged between the input node N2 of the second current mirror circuit 256 and the switching line VS. The second diode D42 allows the electric potential at the node N2 to be clamped with $(V_S-V_f)$ as its lower limit. This arrangement is capable of preventing overvoltage from being applied to the second current mirror circuit 256.

Figure 11:
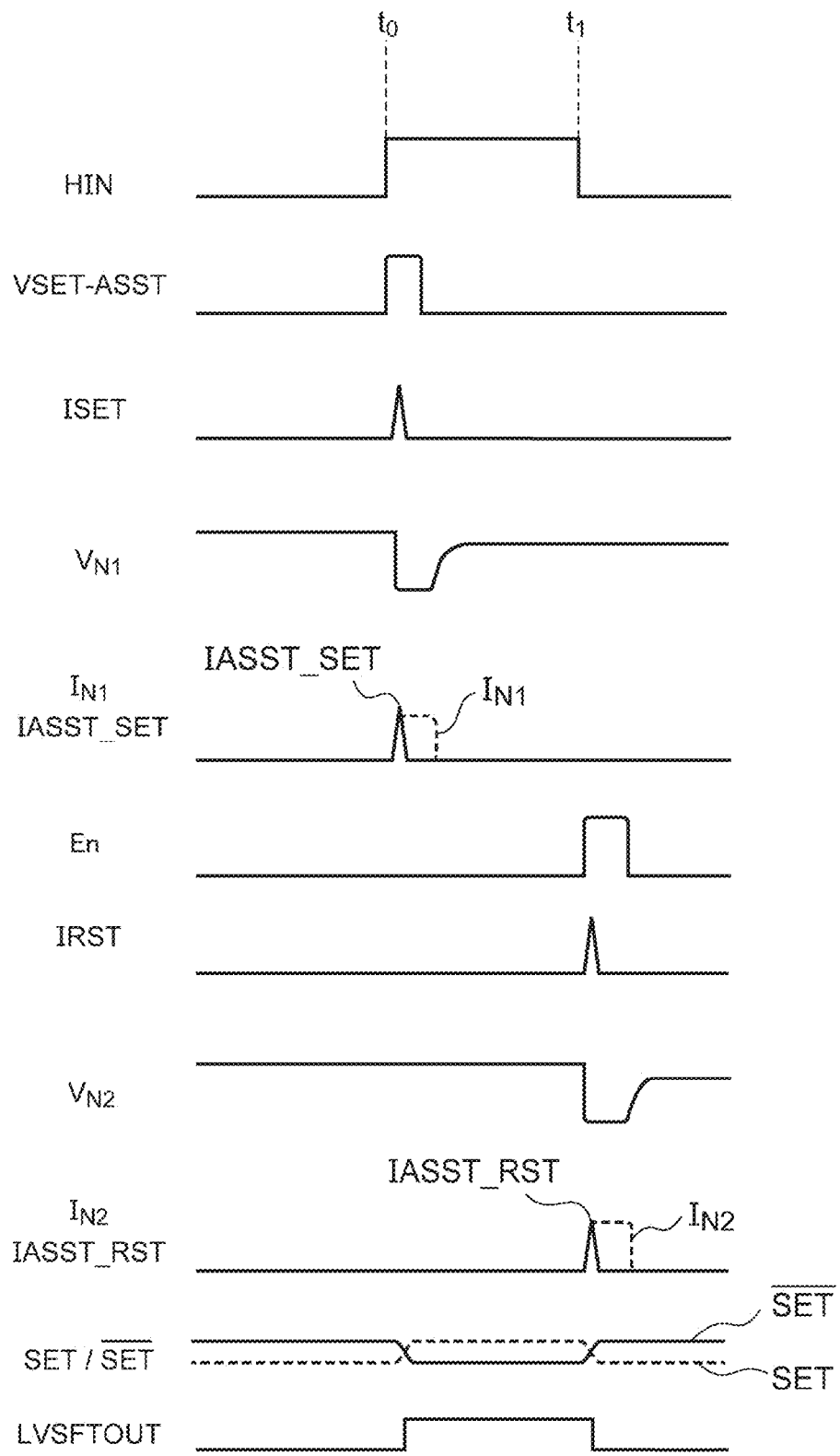
FIG. 11 is an operation waveform diagram showing the operation of the level shift circuit shown in FIG. 10.

FIG. 11 is an operation waveform diagram showing the operation of the level shift circuit 220 shown in FIG. 10. At the time point $t_0$, the input signal HIN transits from the low level to the high level. When the set pulse Ep is set to the high level at the time point $t_0$, the transistor MN11 turns on, which provides the flow of the current $I_{SET}$. The current $I_{SET}$ functions as a trigger for setting the latch circuit 240. When the current $I_{SET}$ flows, this reduces the electric potential at the drain of the transistor MN21 (node N21), thereby acting on the latch circuit 240 such that it is set to the set state.

Furthermore, when the set pulse Ep is set to the high level, the current $I_{N1}$ flows through the transistor MN41. In this state, the first current mirror circuit 254 outputs the assist current IASST_SET. The assist current IASST_SET raises the electric potential at the drain of the transistor MP22 (node N22), thereby assisting the transition of the latch circuit 240 to the set state.

At the time point $t_1$, the input signal HIN transits from the high level to the low level. When the reset pulse En is set to the high level, the transistor MN22 turns on, which provides the flow of the current $I_{RST}$. The current $I_{RST}$ functions as a trigger for resetting the latch circuit 240. When the current $I_{RST}$ flows, this reduces the electric potential at the drain of the transistor MP22 (node N22), thereby acting on the latch circuit 240 such that it is set to the reset state.

On the other hand, when the reset pulse En is set to the high level, the current $I_{N2}$ flows through the transistor MN42, and the second current mirror circuit 256 outputs the assist current IASST_RST. The assist current IASST_RST raises the electric potential at the drain of the transistor MP21 (node N21), thereby assisting the transition of the latch circuit 240 to the reset state.

The above is the active assist operation based on the set pulse Ep and the reset pulse En generated by the pulse generator 230. In addition to the active assist operation, the assist circuit 250 also supports a passive assist operation described below.

Typically, the electric potential $V_S$ at the VS line is switched according to the control signal HIN. However, in some cases, the electric potential $V_S$ at the VS line fluctuates due to the effects of disturbance. When the voltage $V_S$ at the VS line rises due to such disturbance, the voltage $V_B$ at the VB line also rises. In this case, the electric potentials at the nodes N21 and N22 of the latch circuit 240 also need to be to be raised following the voltage $V_B$ at the VB line. The assist circuit 250 assists in raising the electric potentials at the nodes N21 and N22.

When the voltage $V_S$ at the VS line rises, charging currents $I_{N1}$ and $I_{N2}$ flow, which are used to charge the parasitic capacitances Cp3 and Cp4 that occur in the transistors MN41 and MN42 each configured as a DMOS transistor. The charging currents $I_{N1}$ and $I_{N2}$ are copied by the current mirror circuits 254 and 256 so as to supply the assist currents IASST_SET and IASST_RST to the nodes N21 and N22. This allows the electric potentials at the nodes N21 and N22 of the latch circuit 240 to be rapidly raised following the rise of the voltage $V_B$ at the VB line. The above is the passive assist operation.

Embodiment 2

Description has been made above regarding an arrangement in which the level shift circuit 220 is configured as a level shift up circuit. Also, the configuration of the level shift circuit 220 may be top/down inverted. That is to say, the level shift circuit 220 may be configured as a level shift down circuit.

Figure 12:
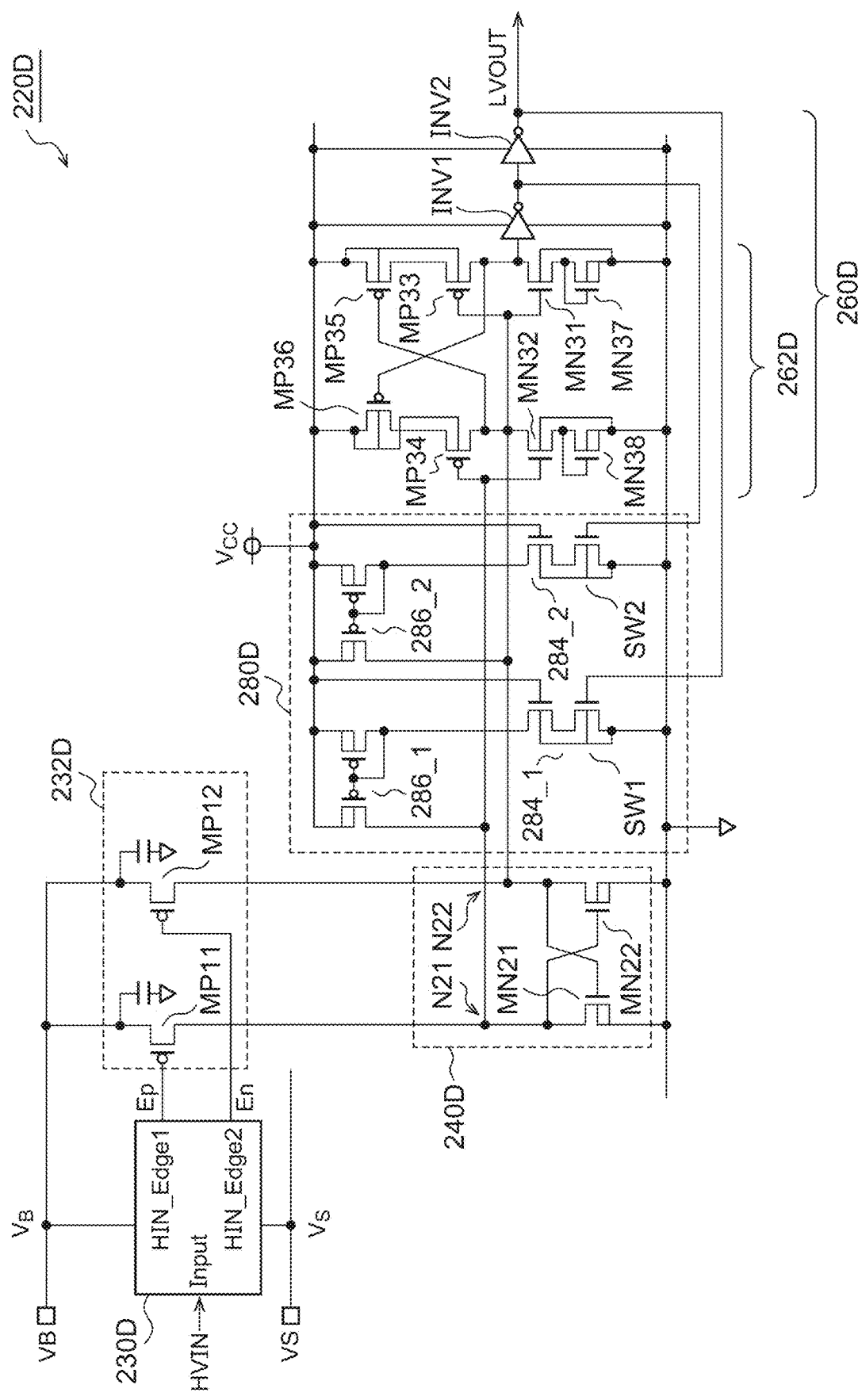
FIG. 12 is a circuit diagram showing a level shift circuit according to an embodiment 2.

FIG. 12 is a circuit diagram showing a level shift circuit 220D according to an embodiment 2. The level shift circuit 220 is configured as a level shift down circuit configured to convert a high voltage input HVIN that is switchable between $V_B$ employed as the high level and $V_S$ employed as the low level into a low voltage output LVOUT that is switchable between the power supply voltage $V_{CC}$ employed as the high level and the ground voltage 0 V employed as the low level.

The level shift circuit 220D has the same basic configuration as that of the level shift circuit 220 shown in FIG. 6. The level shift circuit 220D includes a pulse generator 230D, an open drain circuit 232D, a latch circuit 240D, a latch stabilization circuit 280D, and a logic circuit 260D.

The pulse generator 230D generates a set pulse Ep and a reset pulse En that are asserted (set to the low level) in response to a positive edge and a negative edge of the input signal HVIN.

The open drain circuit 232D has a configuration obtained by top/bottom inversion of the configuration of the open drain circuit 232 shown in FIG. 6, and by replacing the NMOS transistors MN11 and MN12 thereof with PMOS transistors MP11 and MP12.

The latch circuit 240D has a configuration obtained by top/bottom inversion of the configuration of the latch circuit 240 shown in FIG. 6, and by replacing the PMOS transistors MP21 and MP22 thereof with NMOS transistors MN21 and MN22.

The latch stabilization circuit 280D selects one node that corresponds to the output LVOUT of the level shift circuit 220D from among the first node N21 and the second node N22 configured as a complementary node pair provided to the latch circuit 240, and fixedly sets the node thus selected to the high level.

For example, the latch stabilization circuit 280D has a configuration obtained by top/bottom inversion of the configuration of the latch stabilization circuit 280 shown in FIG. 6, and by mutually replacing the NMOS transistors and the PMOS transistors thereof. Furthermore, the level shifter/latch circuit 262D has a configuration obtained by top/bottom inversion of the configuration of the level shifter/ latch circuit 262 shown in FIG. 6, by replacing the PMOS transistors MP31 and MP32 shown in FIG. 6 with NMOS transistors MN31 and MN32, and by replacing the NMOS transistors MN33 through MN36 shown in FIG. 6 with PMOS transistors MP33 through MP36. Furthermore, the level shifter/latch circuit 262D further includes NMOS transistors MN37 and MN38. The NMOS transistors MN37 and MN38 are provided in order to shift the circuit operation point toward the high electric potential side. The NMOS transistors MN37 and MN38 may be omitted depending on the voltage level of the power supply voltage $V_{CC}$.

Figure 13:
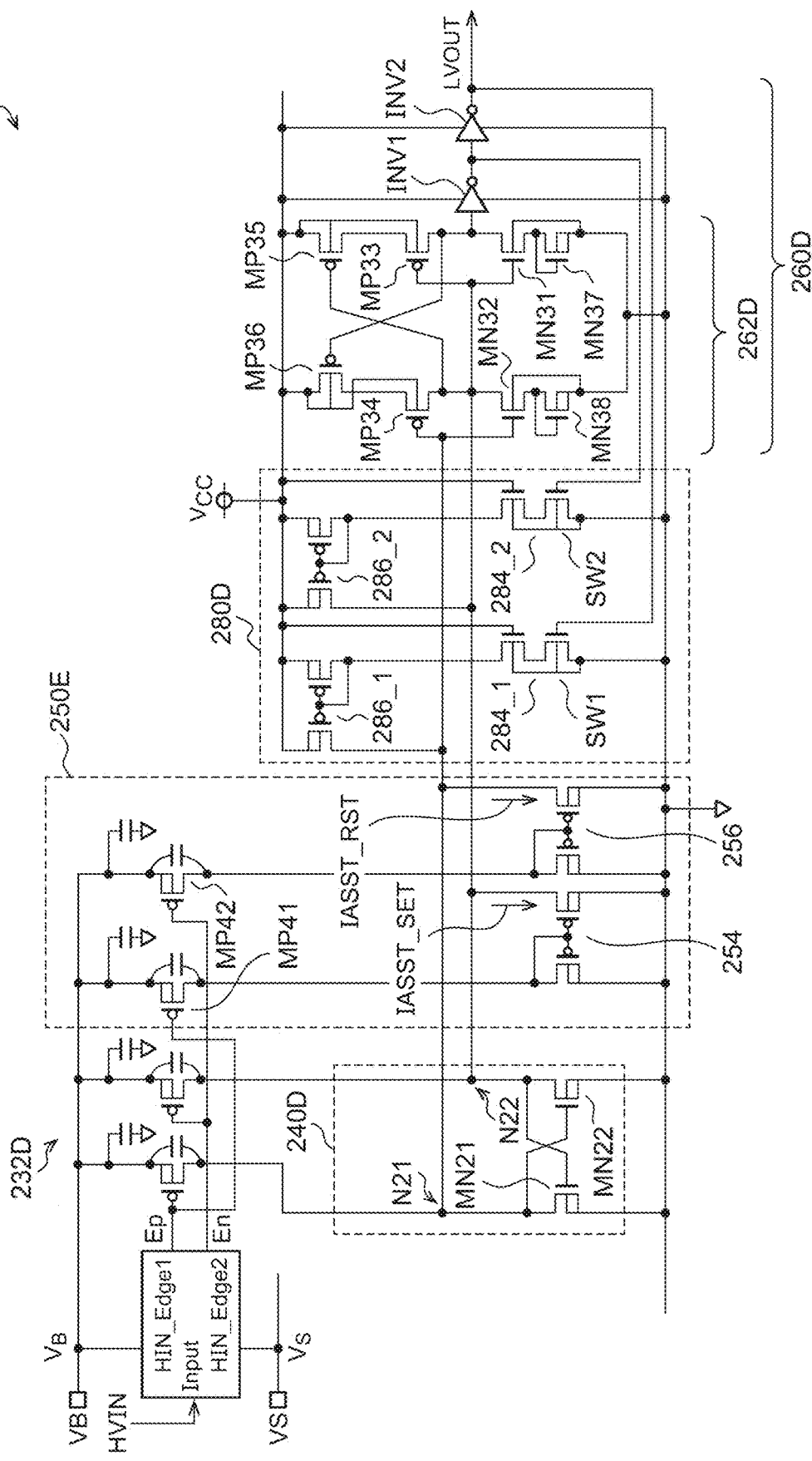
FIG. 13 is a circuit diagram showing a modification of the level shift circuit shown in FIG. 12.

Also, the level shift circuit 220D shown in FIG. 12 may include an assist circuit as an additional component. FIG. 13 is a circuit diagram showing a level shift circuit 220E according to a modification shown in FIG. 12. The level shift circuit 220E further includes an assist circuit 250E in addition to the configuration of the level shift circuit 220D shown in FIG. 12.

By providing such a level shift circuit 220E, such an arrangement provides higher-speed operations. Furthermore, when the VB (VS) rises, currents flow to the nodes N21 and N22 via the capacitances Cds of the PDMOS transistors MP11 and MP12. This acts such that the electric potential of each node rises. By providing the assist circuit 250E, the currents that flow due to the capacitances Cds of the PDMOS transistors MP41 and MP42 arranged on the assist circuit 250E side are copied by the current mirror circuits 254 and 256 and are drawn as the assist currents IASST_SET and IASST_RST. This suppresses an increase in the voltages at the nodes N21 and N22.

Usage

Figure 14:
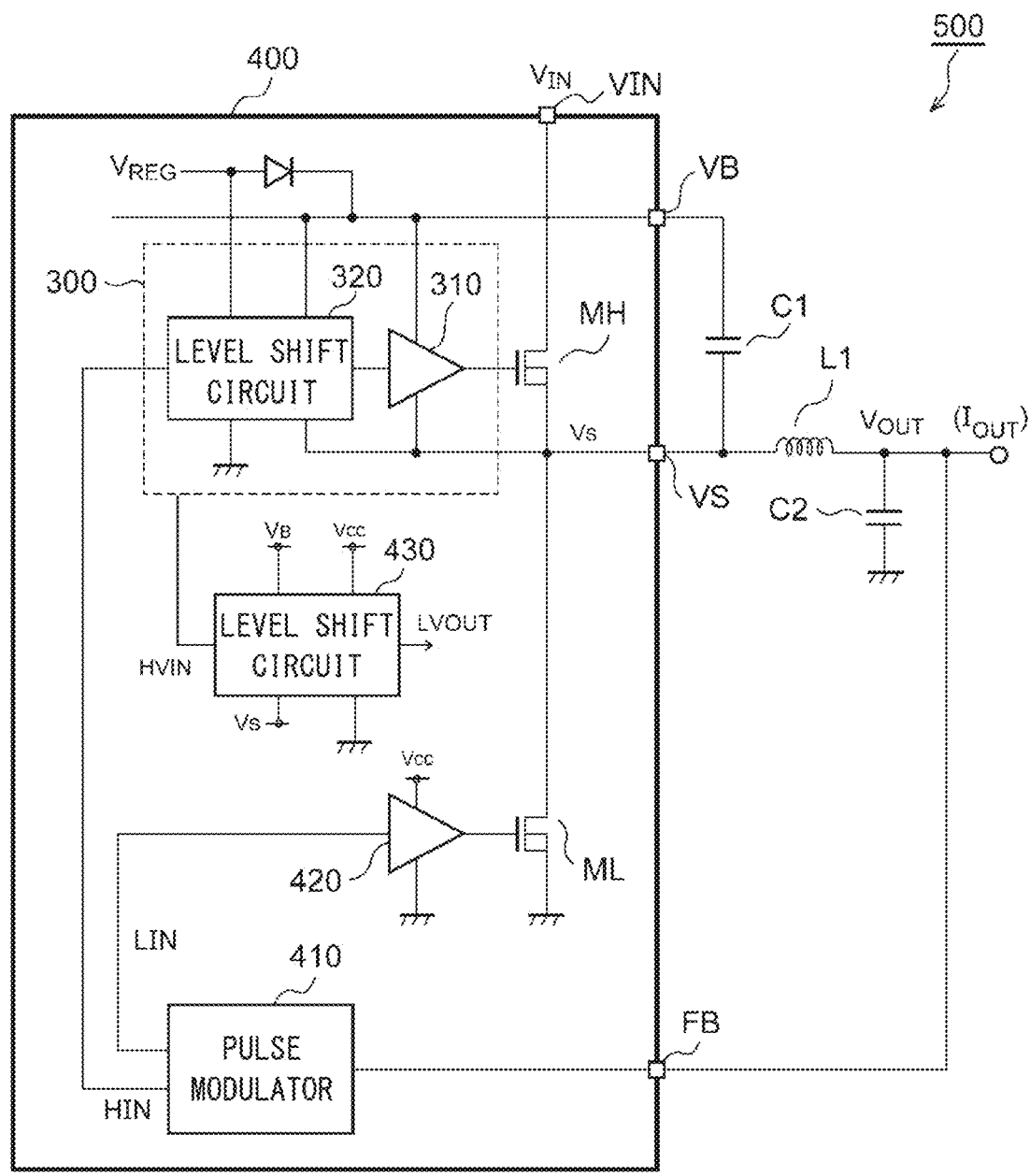
FIG. 14 is a circuit diagram showing a controller for a DC/DC converter.

Next, description will be made regarding the usage of the semiconductor apparatus 102. The semiconductor apparatus 102 may be applied to a DC/DC converter. FIG. 14 is a circuit diagram showing a controller 400 of a DC/DC converter 500. The DC/DC converter 500 is configured as a synchronous rectification step-down (Buck) converter. The DC/DC converter 500 includes capacitors C1 and C2 and an inductor L1 in addition to the controller 400.

The controller 400 includes a high-side transistor MH, a low-side transistor ML, a pulse modulator 410, a low-side driving circuit 420, and a driving circuit (high-side driving circuit) 200. The pulse modulator 410 generates pulse signals HIN and LIN such that an output (output voltage, output current, or load state) of the DC/DC converter 500 approaches a target value. For example, the pulse modulator 410 may operate such that the output voltage $V_{OUT}$ approaches a target voltage $V_{REF}$ (constant voltage control) or such that the output current $I_{OUT}$ approaches a target current $I_{REF}$ (constant current control).

The high-side driving circuit 200 drives the high-side transistor MH, which is configured as an N-channel transistor or NPN transistor, according to the pulse signal HIN. The high-side driving circuit 200 includes a level shift circuit 220 and a driver (buffer) 210.

Furthermore, the low-side driving circuit 420 drives the low-side transistor ML according to the pulse signal LIN.

The controller 400 may further include a level shift circuit 430. The level shift circuit 430 level shifts down the high-voltage signal HVIN generated by the high-side driving circuit 200 to a low-voltage signal LVOUT with the ground voltage 0 V as the reference voltage. The level shift circuit 430 may have the same configuration as that of the level shift circuit 220D shown in FIG. 12.

The kind of the high-voltage signal HVIN is not restricted in particular. For example, the high-voltage signal HVIN may be generated as an abnormal state detection signal generated by the high-side driving circuit 200. Also, the high-voltage signal HVIN may be generated as the gate signal of the high-side transistor MH. The output of the level shift circuit 430 is input to the pulse modulator 410 or an unshown logic circuit.

Figure 15:
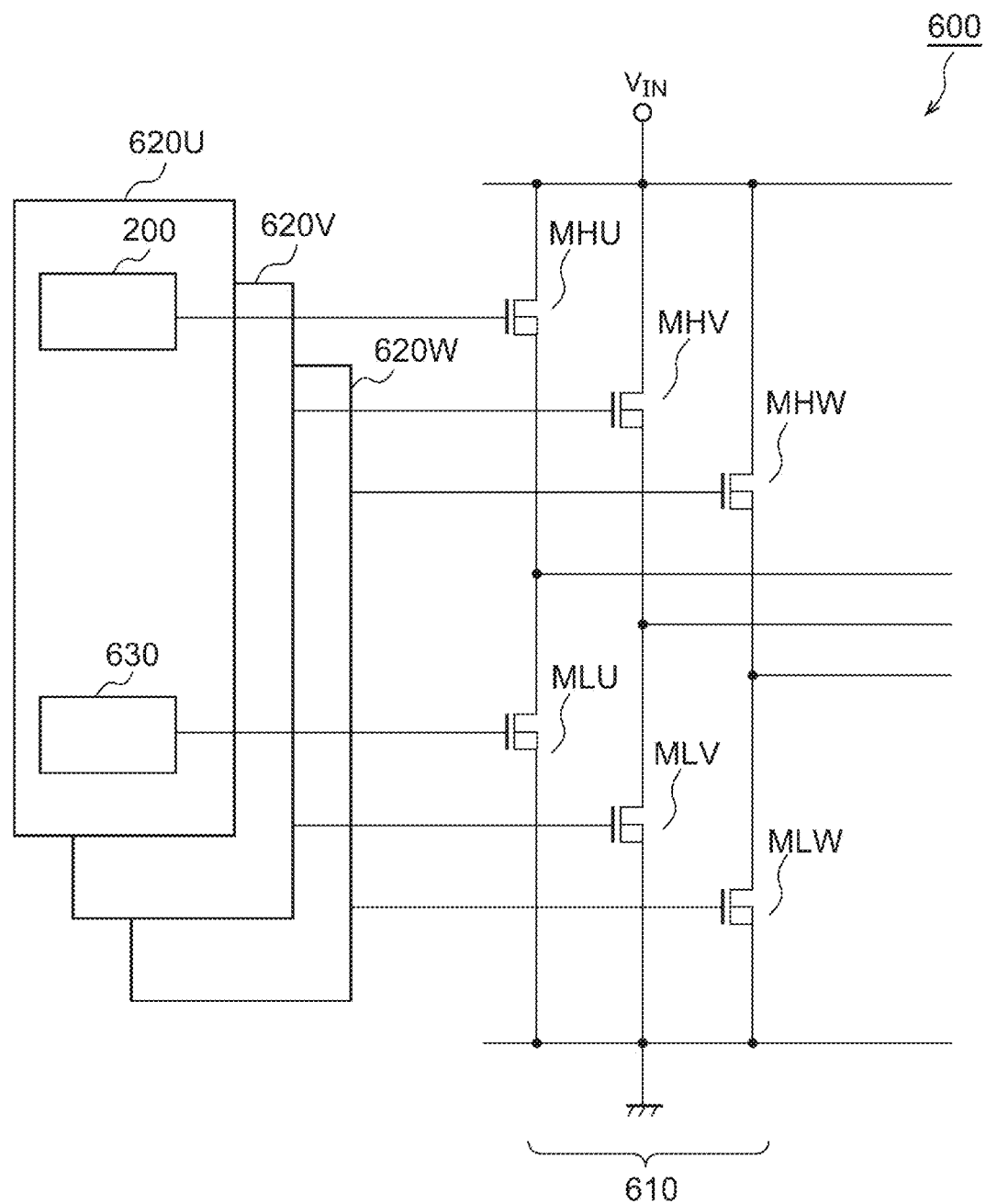
FIG. 15 is a circuit diagram showing an inverter apparatus including a high-side driving circuit.

The semiconductor apparatus 102 is applicable to an inverter apparatus. FIG. 15 is an inverter apparatus 600 including a high-side driving circuit 300. The inverter apparatus 600 includes a three-phase inverter 610, and U-phase, V-phase, and W-phase driving circuits 620U, 620V, and 620W. The three-phase inverter 610 includes high-side transistors MHU, MHV, and MHW, and low-side transistors MLU, MLU, and MLW. Each driving circuit 620# ("#" represents "U", "V", or "W") includes a high-side driving circuit 200 and a low-side driving circuit 630.

Description has been made above regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

Description has been made in the embodiments regarding an arrangement in which the high-side transistor MH is configured as an N-channel MOSFET. Also, the high-side transistor MH may be configured as an NPN bipolar transistor or IGBT. In this case, the gate, source, and drain correspond to the base, emitter, and drain.

Second Modification

Description has been made in the embodiments regarding an arrangement in which the high-side transistor MH is configured as a discrete component. Also, the high-side transistor MH may be integrated on the same IC as the semiconductor apparatus 102.

Third Modification

In the DC/DC converter 500 shown in FIG. 14, the low-side transistor ML may be replaced with a diode. However, the DC/DC converter 500 is not restricted to such a step-down topology. Also, other kinds of configurations including a high-side transistor may be employed.

Fourth Modification

The usage of the switching circuit 100 is not restricted to such a DC/DC converter or an inverter apparatus. For example, the switching circuit 100 is also applicable to bidirectional converters, battery charger circuits, and class D audio amplifiers.

While the preferred embodiments of the present invention have been described using specific terms, such description is for illustrative purposes only, and it is to be understood that changes and variations may be made without departing from the spirit or scope of the appended claims.

What is claimed is:

1. A driving circuit for an N-channel or NPN high-side transistor, comprising:
   a level shift circuit structured to shift up an input signal; and
   a buffer structured to drive the high-side transistor according to an output of the level shift circuit,
   wherein the level shift circuit comprises:
      a pulse generator structured to generate a set pulse having a predetermined pulse width according to a positive edge of the input signal, and to generate a reset pulse having a predetermined pulse width according to a negative edge of the input signal;
      an open drain circuit comprising a first N-type transistor having its source grounded and its gate receiving the set pulse, and structured to turn on when the set pulse is high, and a second N-type transistor having its source grounded and a gate receiving the reset pulse, and structured to turn on when the reset pulse is high;
      a latch circuit comprising a cross-coupled first P-type transistor and second P-type transistor, wherein the first P-type transistor has its drain coupled to a drain of the first N-type transistor, and the second P-type transistor has its drain coupled to a drain of the second N-type transistor, and structured to switch a state thereof in response to an output of the open drain circuit; and
      a latch stabilization circuit arranged between a high-side line and a switching line, and structured to fix the drain of the first P-type transistor to low when the open drain circuit is in a first state, and to fix the drain of the second P-type transistor to low when the open drain circuit is in a second states,
   wherein the latch stabilization circuit is structured to select a node that corresponds to the output of the level shift circuit, from among the first node and the second node configured as complementary nodes provided to the latch circuit, and to sink a current from the node thus selected.

2. The driving circuit according to claim 1 wherein the latch stabilization circuit comprises:
   a first current source structured such that, when the output of the level shift circuit is set to a first level, the first current source is turned on, so as to sink a current from the first node of the latch circuit; and
   a second current source structured such that, when the output of the level shift circuit is set to a second level, the second current source is turned on, so as to sink a current from the second node of the latch circuit.

3. The driving circuit according to claim 2, wherein the first current source comprises:
   a first switch structured such that, when the output of the level shift circuit is set to the first level, the first switch is turned on;
   a first impedance element coupled in series with the first switch; and
   a first current mirror circuit structured to copy a current that flows through the first impedance element, and to sink a current from the first node,
   and wherein the second current source comprises:
      a second switch structured such that, when the output of the level shift circuit is set to the second level, the second switch is turned on;
      a second impedance element coupled in series with the second switch; and
      a second current mirror circuit structured to copy a current that flows through the second impedance element, and to sink a current from the second node.

4. The driving circuit according to claim 3, wherein the first impedance element and the second impedance element are each configured as a PMOS transistor having its gate coupled to the switching line.

5. The driving circuit according to claim 1 wherein the latch stabilization circuit comprises:
   a first variable impedance element arranged between the switching line and one from among the first node and the second node configured as complementary nodes provided to the latch circuit; and
   a second variable impedance element arranged between the switching line and the other from among the first node and the second node,
   and wherein an impedance of the first variable impedance element and an impedance of the second variable impedance element are controlled in a complementary manner according to the output of the level shift circuit.

6. The driving circuit according to claim 1 wherein the level shift circuit further comprises a level shifter/latch circuit provided as a downstream stage of the latch circuit, and wherein the level shifter/latch circuit comprises:
   a first PMOS transistor having its source coupled to the high-side line and its gate coupled to the first node;
   a second PMOS transistor having its source coupled to the high-side line and its gate coupled to the second node;
   a third NMOS transistor having its drain coupled to a drain of the first PMOS transistor and its gate coupled to the first node;
   a fourth NMOS transistor having its drain coupled to a drain of the second PMOS transistor and its gate coupled to the second node;
   a fifth NMOS transistor having its drain coupled to a source of the third NMOS transistor, its gate coupled to a drain of the second PMOS transistor, and its source coupled to the switching line; and
   a sixth NMOS transistor having its drain coupled to a source of the fourth NMOS transistor, its gate coupled to a drain of the first PMOS transistor, and its source coupled to the switching line.

7. The driving circuit according to claim 1, wherein the level shift circuit further comprises an assist circuit structured to inject an assist current to the second node in response to the set pulse, and to inject an assist current to the first node in response to the reset pulse.

8. The driving circuit according to claim 7, wherein the assist circuit comprises:
   a first transistor structured as an N-channel transistor, and structured to receive the set pulse via a gate thereof;
   a first current mirror circuit coupled to the high-side line, and structured to mirror a current that flows through the first transistor;
   a second transistor structured as an N-channel transistor, and structured to receive the reset pulse via a gate thereof; and
   a second current mirror circuit coupled to the high-side line, and structured to mirror a current that flows through the second transistor.

9. A switching circuit comprising:
   a high-side transistor arranged between an input line and a switching line;
   a low-side transistor arranged between the switching line and a ground line; and the driving circuit according to claim 1, structured to drive the high-side transistor.

10. A controller for a DC/DC converter, comprising:
a pulse generator structured to generate a pulse signal such that an output of the DC converter approaches a target value; and
a driving circuit structured to drive a high-side transistor configured as an N-channel or NPN transistor, according to the pulse signal,
wherein the driving circuit comprises:
a first level shift circuit structured to receive the pulse signal as an input signal thereof, and to shift up the input signal; and
a buffer structured to drive the high-side transistor according to an output of the first level shift circuit,
and wherein the first level shift circuit comprises:
a pulse generator structured to generate a set pulse having a predetermined pulse width according to a positive edge of the input signal, and to generate a reset pulse having a predetermined pulse width according to a negative edge of the input signal;
an open drain circuit comprising a first N-type transistor with a grounded source and a gate receiving the set pulse, structured to turn on when the set pulse is high, and a second N-type transistor with a grounded source and a gate receiving the reset pulse, structured to turn on when the reset pulse is high;
a latch circuit comprising a cross-coupled first P-type transistor and second P-type transistor, wherein the first P-type transistor has its drain coupled to a drain of the first N-type transistor, and the second P-type transistor has its drain coupled to a drain of the second N-type transistor, and structured to switch a state thereof in response to an output of the open drain circuit; and
a latch stabilization circuit arranged between a high-side line and a switching line, and structured to fix the drain of the first P-type transistor to low when the open drain circuit is in a first state, and to fix the drain of the second P-type transistor to low when the open drain circuit is in a second states,
wherein the latch stabilization circuit is structured to select a node that corresponds to the output of the first level shift circuit, from among the first node and the second node configured as complementary nodes provided to the latch circuit, and to sink a current from the node thus selected.

11. The driving circuit according to claim 10 wherein the latch stabilization circuit comprises:
a first current source structured such that, when the output of the first level shift circuit is set to a first level, the first current source is turned on, so as to sink a current from the first node of the latch circuit; and
a second current source structured such that, when the output of the first level shift circuit is set to a second level, the second current source is turned on, so as to sink a current from the second node of the latch circuit.

12. The controller according to claim 11, wherein the first current source comprises:
a first switch structured such that, when the output of the first level shift circuit is set to the first level, the first switch is turned on;
a first impedance element coupled in series with the first switch; and
a first current mirror circuit structured to copy a current that flows through the first impedance element, and to sink a current from the first node,
and wherein the second current source comprises:
a second switch structured such that, when the output of the first level shift circuit is set to the second level, the second switch is turned on;
a second impedance element coupled in series with the second switch; and
a second current mirror circuit structured to copy a current that flows through the second impedance element, and to sink a current from the second node.

13. The controller according to claim 12, wherein the first impedance element and the second impedance element are each configured as a PMOS transistor having its gate coupled to the switching line.

14. The driving circuit according to claim 10 wherein the latch stabilization circuit comprises:
a first variable impedance element arranged between the switching line and one from among the first node and the second node configured as complementary nodes provided to the latch circuit; and
a second variable impedance element arranged between the switching line and the other from among the first node and the second node,
and wherein an impedance of the first variable impedance element and an impedance of the second variable impedance element are controlled in a complementary manner according to the output of the first level shift circuit.

15. The driving circuit according to claim 10 wherein the first level shift circuit further comprises a level shifter/latch circuit provided as a downstream stage of the latch circuit,
and wherein the level shifter/latch circuit comprises:
a first PMOS transistor having its source coupled to the high-side line, and its gate coupled to the first node;
a second PMOS transistor having its source coupled to the high-side line, and its gate coupled to the second node;
a third NMOS transistor having its drain coupled to a drain of the first PMOS transistor, and its gate coupled to the first node;
a fourth NMOS transistor having its drain coupled to a drain of the second PMOS transistor, and its gate coupled to the second node;
a fifth NMOS transistor having its drain coupled to a source of the third NMOS transistor, its gate coupled to a drain of the second PMOS transistor, and its source coupled to the switching line; and
a sixth NMOS transistor having its drain coupled to a source of the fourth NMOS transistor, its gate coupled to a drain of the first PMOS transistor, and its source coupled to the switching line.

16. The controller according to claim 10, wherein the first level shift circuit further comprises an assist circuit structured to inject an assist current to the second node in response to the set pulse, and to inject an assist current to the first node in response to the reset pulse.

17. The controller according to claim 16, wherein the assist circuit comprises:
a first transistor structured as an N-channel transistor, and structured to receive the set pulse via a gate thereof;
a first current mirror circuit coupled to the high-side line, and structured to mirror a current that flows through the first transistor;
a second transistor structured as an N-channel transistor, and structured to receive the reset pulse via a gate thereof; and a second current mirror circuit coupled to the high-side line, and structured to mirror a current that flows through the second transistor.

18. The driving circuit according to claim 10 wherein the driving circuit further comprises a second level shift circuit structured to receive an internal signal generated by the driving circuit, and to shift down the internal signal thus received, and wherein the second level shift circuit has a configuration obtained by top/bottom inversion of a configuration of the first level shift circuit, and by mutual replacement of polarities of transistors included in the first level shift circuit.

19. A driving circuit for a high-side transistor configured as an N-channel or NPN transistor, comprising a level shift circuit structured to shift down an input signal, wherein the level shift circuit comprises:
 a pulse generator arranged between a high-side line and a switching line, and structured to generate a set pulse having a predetermined pulse width according to a positive edge of the input signal, and to generate a reset pulse having a predetermined pulse width according to a negative edge of the input signal;
 an open drain circuit comprising a first N-type transistor having its source coupled to the high-side line and its gate receiving the set pulse, and structured to turn on when the set pulse is high, and a second N-type transistor having its source coupled to the high-side line and a gate receiving the reset pulse, and structured to turn on when the reset pulse is high;
 a latch circuit comprising a cross-coupled first P-type transistor and second P-type transistor, wherein the first P-type transistor has its drain coupled to a drain of the first N-type transistor, and the second P-type transistor has its drain coupled to a drain of the second N-type transistor, and structured to switch a state thereof in response to an output of the open drain circuit; and
 a latch stabilization circuit arranged between a power supply line and a ground line, and structured to fix the drain of the first P-type transistor to low when the open drain circuit is in a first state, and to fix the drain of the second P-type transistor to low when the open drain circuit is in a second states,
wherein the latch stabilization circuit is structured to select a node that corresponds to the output of the level shift circuit, from among the first node and the second node configured as complementary nodes provided to the latch circuit, and to sink a current from the node thus selected.

* * * * *